US009634092B2

(12) United States Patent
Bhuwalka et al.

(10) Patent No.: US 9,634,092 B2
(45) Date of Patent: Apr. 25, 2017

(54) SEMICONDUCTOR DEVICES HAVING TAPERED ACTIVE REGIONS

(71) Applicant: Samsung Electronics Co., Ltd., Suwon-si, OT (KR)

(72) Inventors: Krishna Kumar Bhuwalka, Suwon-si (KR); Zhenhua Wu, Suwon-si (KR); Uihui Kwon, Hwaseong-si (KR); Keunho Lee, Seongnam-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/046,455

(22) Filed: Feb. 18, 2016

(65) Prior Publication Data

US 2016/0254348 A1    Sep. 1, 2016

(30) Foreign Application Priority Data

Feb. 26, 2015    (KR) .................. 10-2015-0027476

(51) Int. Cl.
| | |
|---|---|
| *H01L 29/06* | (2006.01) |
| *H01L 29/423* | (2006.01) |
| *H01L 29/66* | (2006.01) |
| *H01L 29/775* | (2006.01) |
| *H01L 29/778* | (2006.01) |
| *H01L 29/78* | (2006.01) |

(Continued)

(52) U.S. Cl.
CPC ...... *H01L 29/0673* (2013.01); *H01L 29/1037* (2013.01); *H01L 29/42392* (2013.01); *H01L 29/66795* (2013.01); *H01L 29/775* (2013.01); *H01L 29/7782* (2013.01); *H01L 29/785* (2013.01); *H01L 29/78696* (2013.01); *H01L 29/0676* (2013.01); *H01L 29/41775* (2013.01)

(58) Field of Classification Search
CPC ............ H01L 29/0673; H01L 29/1037; H01L 29/42392; H01L 29/66795; H01L 29/775; H01L 29/7782; H01L 29/785; H01L 29/78696
See application file for complete search history.

(56) References Cited

U.S. PATENT DOCUMENTS

| | | | | |
|---|---|---|---|---|
| 4,996,574 | A * | 2/1991 | Shirasaki | .......... H01L 29/42376 257/347 |
| 6,566,695 | B2 | 5/2003 | Kumashiro | |

(Continued)

FOREIGN PATENT DOCUMENTS

JP    2001-308320    2/2001

*Primary Examiner* — Karen Kusumakar
(74) *Attorney, Agent, or Firm* — Muir Patent Law, PLLC

(57) ABSTRACT

Provided is a finFET device. The finFET device may include an active region which protrudes vertically from a substrate, a channel region disposed on a center of the active region, a drain region disposed on one side surface of the channel region, and a source region disposed on the other side surface of the channel region, a gate insulating layer formed on two opposing side surfaces of the channel region and having a U-shaped cross-section, gate spacers formed on outer surfaces of the gate insulating layer, drain spacers formed on two opposing side surfaces of the drain region, and source spacers formed on two opposing side surfaces of the source region, and at least one of the two side surfaces of the drain region has a tapered part.

19 Claims, 22 Drawing Sheets

(51) Int. Cl.
    *H01L 29/786*     (2006.01)
    *H01L 29/10*     (2006.01)
    *H01L 29/417*     (2006.01)

(56) References Cited

U.S. PATENT DOCUMENTS

| | | |
|---|---|---|
| 6,858,478 B2 * | 2/2005 | Chau ............... B82Y 10/00 |
| | | 257/E29.137 |
| 7,332,386 B2 | 2/2008 | Lee et al. |
| 7,332,774 B2 * | 2/2008 | Cho ............... H01L 29/785 |
| | | 257/338 |
| 7,348,642 B2 | 3/2008 | Nowak |
| 8,106,464 B2 | 1/2012 | Cho et al. |
| 8,263,446 B2 | 9/2012 | Cheng et al. |
| 8,373,167 B2 | 2/2013 | Horch |
| 2005/0253193 A1 * | 11/2005 | Chen ............... H01L 29/665 |
| | | 257/347 |
| 2012/0168711 A1 | 7/2012 | Crowder et al. |
| 2014/0252477 A1 | 9/2014 | Tseng et al. |
| 2014/0327091 A1 | 11/2014 | Lin et al. |
| 2014/0332815 A1 | 11/2014 | Basker et al. |
| 2014/0335673 A1 | 11/2014 | Kim et al. |

* cited by examiner

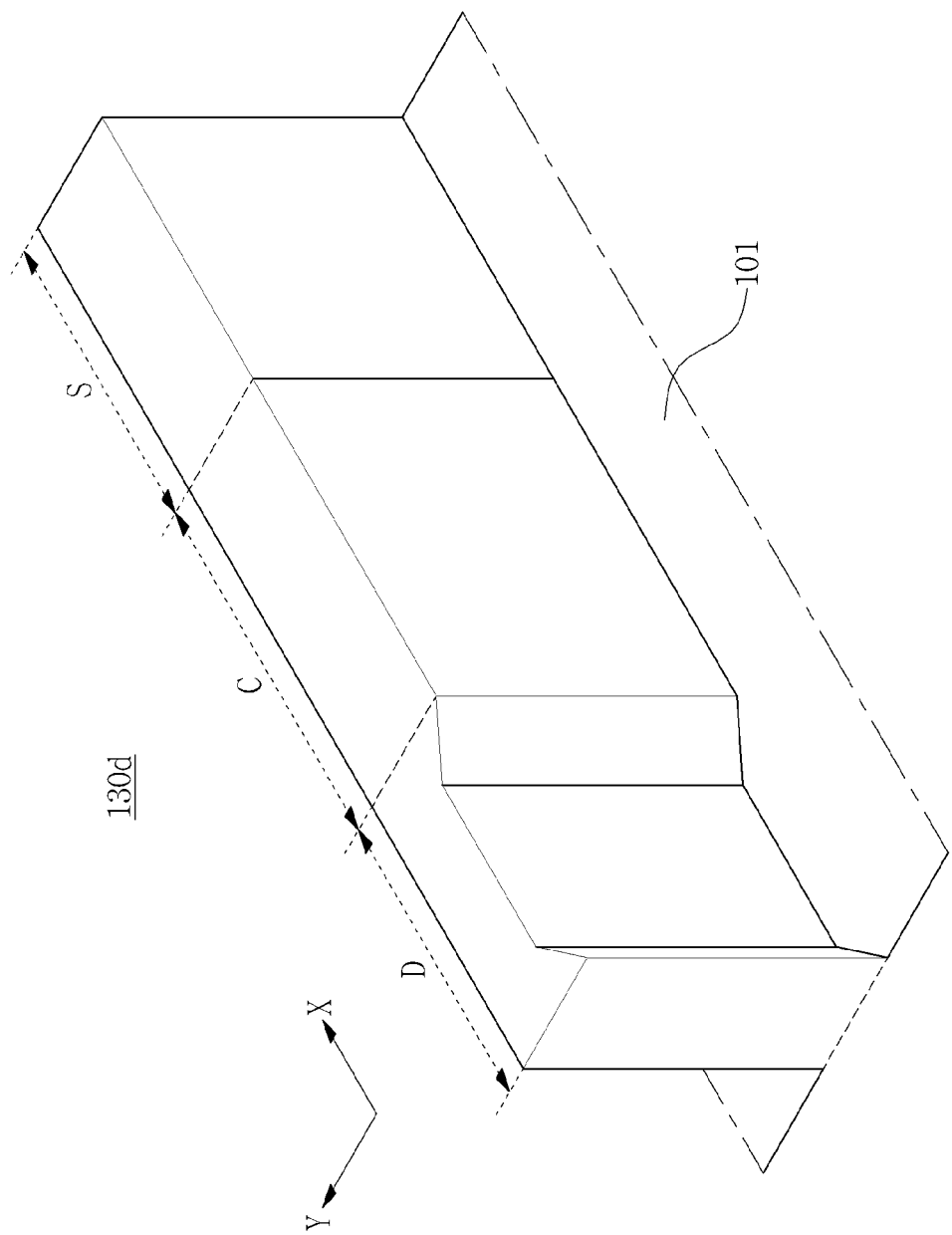

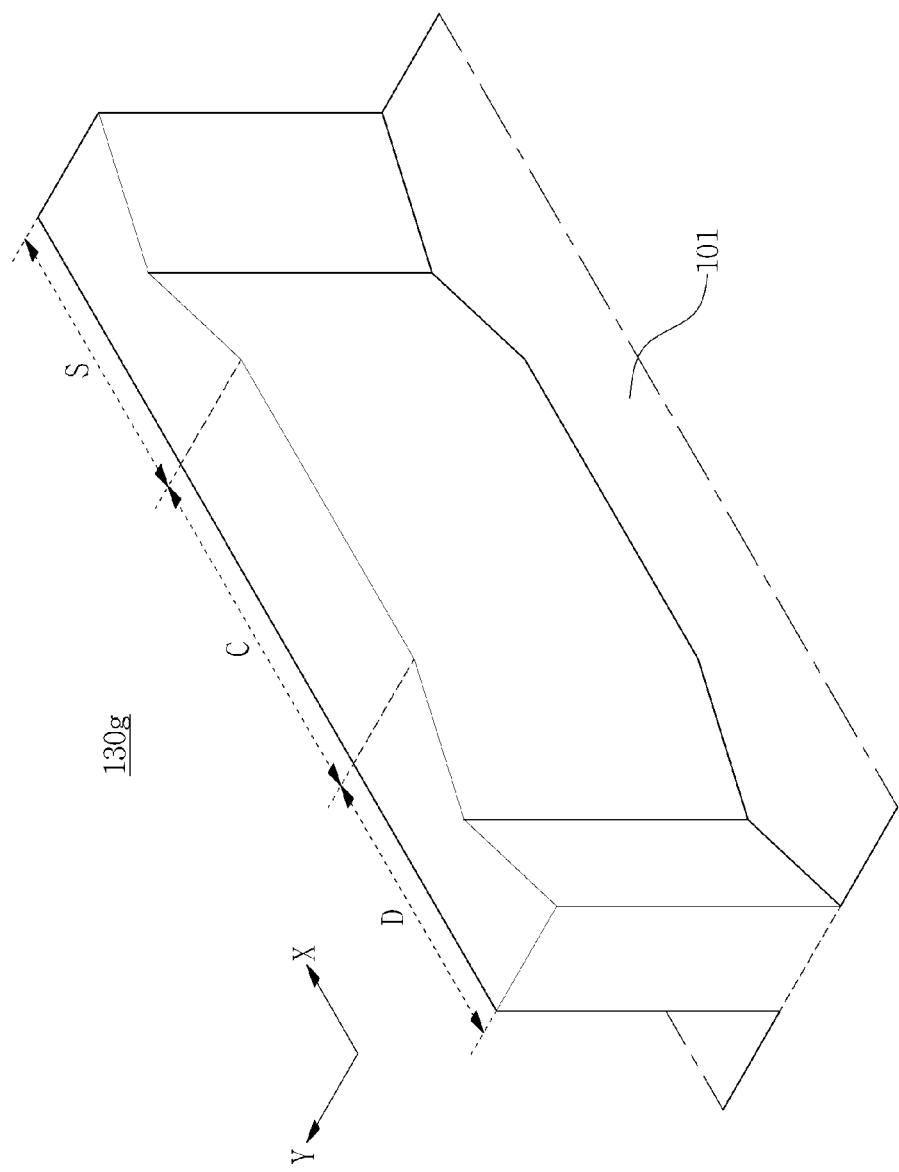

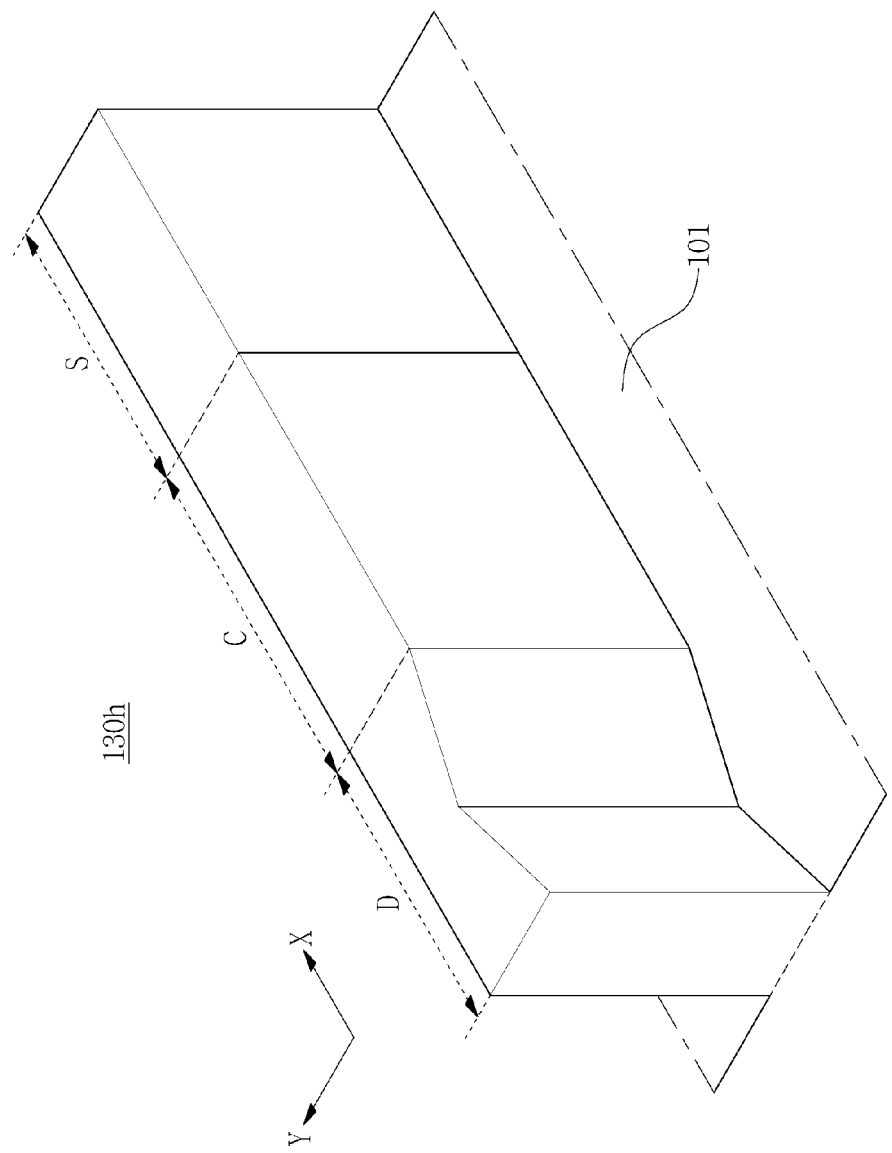

SEMICONDUCTOR DEVICES HAVING TAPERED ACTIVE REGIONS

CROSS-REFERENCE TO RELATED APPLICATION

This application claims priority under 35 U.S.C. §119 to Korean Patent Application No. 10-2015-0027476, filed Feb. 26, 2015, in the Korean Intellectual Property Office, the disclosure of which is hereby incorporated by reference in its entirety.

BACKGROUND

Embodiments of the present disclosure relate to a structural form of an active region of a metal-oxide-semiconductor field-effect transistor (MOSFET) semiconductor device; in particular, a structural form of an active region of a MOSFET having a tapered active region.

As energy barriers are decreased, the probability that electrons pass through (tunneling) potential barriers is increased. This is one cause of leakage current in transistor gates. In order to minimize sizes of metal-oxide-semiconductor field-effect transistor (MOSFET) devices of semiconductor devices and reduce an operating voltage, lengths of channels, widths of fins, or diameters of nanowires have been gradually reduced. For this reason, subthreshold leakage current ($I_{off}$) has emerged as an issue. The $I_{off}$ refers to drain current ($I_d$) which is measured when the value of $V_{GS}$ is 0 V and the value of $V_{DS}$ is $V_{DD}$.

The disclosed embodiments have been provided to address these and other shortcomings.

SUMMARY

Embodiments of the disclosed embodiments provide a structure of a metal-oxide-semiconductor field-effect transistor (MOSFET) semiconductor device.

In some exemplary embodiments, the present disclosure is directed to a finFET device comprising an active region configured to protrude from a substrate, wherein the active region comprises: a channel region disposed at a center of the active region; a drain region disposed on one side of the channel region; a source region disposed on the other side of the channel region; a gate insulating layer formed on two opposing side surfaces of the channel region and having a U-shaped cross-section; gate spacers formed on outer surfaces of the gate insulating layer; drain spacers formed on two opposing side surfaces of the drain region; and source spacers formed on two opposing side surfaces of the source region, and wherein the two opposing side surfaces of the drain region has a tapered region.

In some embodiments, the tapered region of the drain region is in contact with the drain spacer.

In some embodiments, both of the two opposing side surfaces of the drain region have tapered parts.

In some embodiments, in at least one of the two opposing side surfaces of the drain region, a center thereof is planar and both ends thereof are tapered.

In some embodiments, at least one of the two opposing side surfaces of the drain region is tapered from a central part of the drain region to both ends of the drain region in both directions.

In some embodiments, the tapered region of the drain region has a concave curved surface.

In some embodiments, at least one of the two opposing side surfaces of the source region has a tapered part.

In some exemplary embodiments, the present disclosure is directed to a finFET device comprising an active region configured to protrude from a substrate, wherein the active region comprises: a channel region; a drain region disposed on one side of the channel region in an X direction; and a source region disposed on the other side of the channel region in the X direction; and wherein the drain region has two side surfaces opposite in a Y direction perpendicular to the X direction, and a region between the two side surfaces of the drain region is tapered.

In some embodiments, both of the two side surfaces of the drain region are tapered.

In some embodiments, the tapered side surface of the drain region is tapered from both ends of the drain region to a central part of the drain region.

In some embodiments, the central part of the tapered side surface of the drain region is planar.

In some embodiments, the source region has two side surfaces opposite in a Y direction perpendicular to the X direction, and one of the two side surfaces of the source region is tapered.

In some embodiments, the tapered side surface of the source region is tapered from both ends of the source region to a central part of the source region.

In some embodiments, the central part of the tapered side surface of the source region is planar.

In some embodiments, both of the two side surfaces of the source region are tapered.

In some exemplary embodiments, the present disclosure is directed to a finFET device comprising an active region configured to protrude vertically from a substrate, wherein the active region comprises: a channel region disposed at a center of the active region; a drain region disposed on a first side of the channel region; a source region disposed on a second side of the channel region; and a gate insulating layer formed on two opposing side surfaces of the channel region, wherein a region between the two opposing side surfaces of the drain region is tapered.

In some embodiments, the finFET comprises drain spacers formed on two opposing side surfaces of the drain region, wherein the tapered part of the drain region is in contact with the drain spacer.

In some embodiments, in at least one of the two opposing side surfaces of the drain region, a center thereof is planar and both ends thereof are tapered.

In some embodiments, at least one of the two opposing side surfaces of the drain region is tapered from a central part of the drain region to both ends of the drain region in both directions.

In some embodiments, at least one of the two opposing side surfaces of the source region has a tapered part.

BRIEF DESCRIPTION OF THE DRAWINGS

The foregoing and other features and advantages of the inventive concepts will be apparent from the disclosed embodiments, as illustrated in the accompanying drawings in which like reference characters refer to the same parts throughout the different views. The drawings are not necessarily to scale, emphasis instead being placed upon illustrating the principles of the disclosed embodiments. In the drawings:

FIGS. 1A to 1H are exemplary perspective views showing active regions, according to certain disclosed embodiments;

DETAILED DESCRIPTION

Figure 1A:
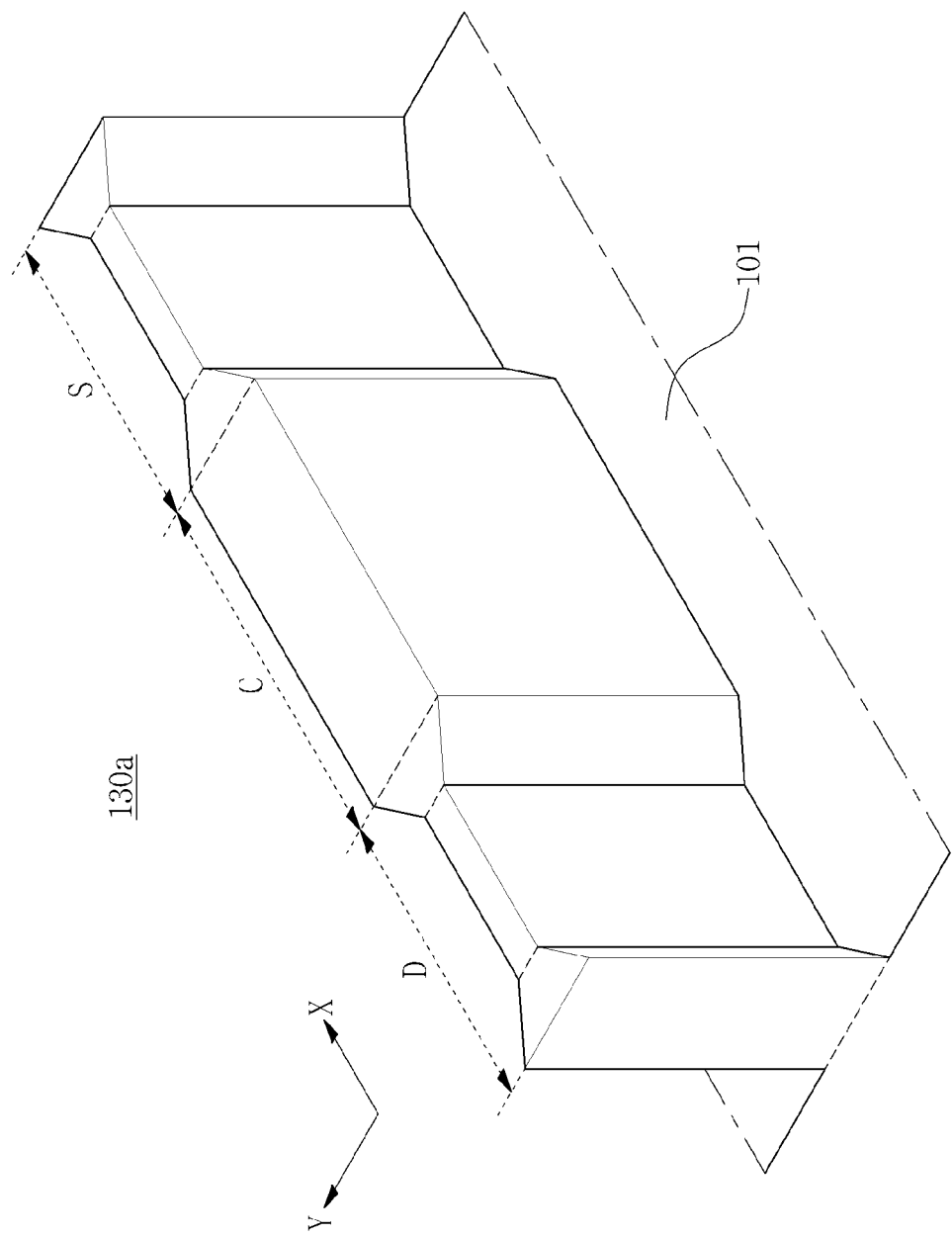

Advantages and features of the disclosed embodiments and methods of accomplishing them will be made apparent with reference to the accompanying drawings and some embodiments to be described below. The disclosed embodiments may, however, be embodied in various different forms, and should be construed as limited, not by the embodiments set forth herein, but only by the accompanying claims. Accordingly, known processes, elements, and techniques are not described with respect to some of the disclosed embodiments. Unless otherwise noted, like reference numerals denote like elements throughout the attached drawings and written description, and thus descriptions will not be repeated. In the drawings, the sizes and relative sizes of layers and regions may be exaggerated for clarity. It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer and/or section from another element, component, region, layer and/or section. Thus, a first element, component, region, layer and/or section discussed below could be termed a second element, component, region, layer and/or section without departing from the teachings of the disclosure.

The terminology used herein is for the purpose of describing particular examples and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, components, and/or groups, and do not preclude the presence or addition of one or more other features, integers, steps, operations, elements, components, and/or groups.

It will be understood that when an element or layer is referred to as being "on," "connected to," "in contact with," and/or "coupled to" another element or layer, it can be directly on, connected to, in contact with and/or coupled to the other element or layer or intervening elements or layers may be present. In contrast, when an element is referred to as being "directly on," "directly connected to," or "directly coupled to" another element or layer or as "contacting" another element or layer, there are no intervening elements or layers present. Like reference numerals throughout this specification denote like elements. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another/other element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" another/other element(s) or feature(s) would then be oriented "above," "on," or "on top of" the another/other element(s) or feature(s). Thus, the term "below" can encompass both an orientation of above and below. The device may be otherwise oriented (rotated 90 degrees or at other orientations) and the spatially relative descriptors used herein may be interpreted accordingly. In addition, it will also be understood that when a layer is referred to as being "between" two layers, it can be the only layer between the two layers, or one or more intervening layers may also be present.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory. A chip or package that includes the semiconductor devices, such as the fin structures described herein, may also be referred to generally as a semiconductor device.

The exemplary embodiments will be described with reference to cross-sectional views and/or plan views, which are ideal exemplary views. Thicknesses of layers and areas are exaggerated for effective description of the technical contents in the drawings. Forms of the embodiments may be modified by the manufacturing technology and/or tolerance. Therefore, the disclosed embodiments are not intended to be limited to illustrated specific forms, and may include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the disclosed embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

finFET

A fin-shaped field effect transistor (finFET) is a transistor architecture that uses raised channels, called "fins," from source to drain. Generally speaking, the thickness of the fin, as measured in the direction from source to drain, may determine the effective channel length of the device. FinFETs may include nonplanar, double-gate transistors built on substrates, such as, for example, silicon or silicon on insulator (SOI) substrates.

As illustrated and described in connection with FIGS. 1A to 1H, the disclosed embodiments, include a source region, a channel, and a drain region, which can also be referred to as a source and drain (to capture the entire source and drain rather than a "region" of a source or drain). In FIGS. 1A to 1H, the active region may include a channel region C, a drain region D disposed on one side surface of the channel region C in an X-direction, and a source region S disposed on the other side surface of the channel region C in the X-direction. That is, the drain region D, channel region C, and source region S may be disposed in a row along the X-direction.

The channel region C may have a top surface that is parallel to the substrate, and two exterior surfaces that are parallel to one another, perpendicular to the substrate, and extend from the substrate to the top surface. The channel region C may also have two side surfaces that are parallel to one another, perpendicular to the substrate, and extend from the substrate to the top surface. One of the two side surfaces of channel region C may be in contact with an inside surface of source region S, and the second of the two side surfaces of channel region C may be in contact with an inside surface of drain region D.

The source region S may have a top surface that is parallel to the substrate and extends from an edge of the inside surface of source region S to an edge of an end surface of source region S. The end surface of source region S may be a planar surface that extends in the Y-direction and the Z-direction. The source region S may have two opposing side that are perpendicular to the substrate and top surface of source region S, and may extend from an edge of the inside surface of source region S to an edge of the end surface of source region S (i.e., the X-direction) and extend from the substrate to an edge of the top surface of source region S (i.e., the Z-direction). In some embodiments, each of the two opposing sides of source region S may be comprised of any combination of a single side portion or multiple side portions. That is, each of the sides of source region S may have a single, planar surface, or one or both sides of source region S may have one or more non-planar portions, as discussed further below.

The drain region D may have a top surface that is parallel to the substrate and extends from an edge of the inside surface of drain region D to an edge of an end surface of drain region D. The end surface of drain region D may be a planar surface that extends in the Y-direction and the Z-direction. The drain region D may have two opposing sides that are perpendicular to the substrate and top surface of drain region D, and may extend from an edge of the inside surface of drain region D to an edge of the end surface of drain region D (i.e., the X-direction) and extend from the substrate to an edge of the top surface of drain region D (i.e., the Z-direction). In some embodiments, the two opposing sides of drain region D may be comprised of any combination of a single side portion or multiple side portions. That is, each of the sides of drain region D may have a single, planar surface, or one or both sides of drain region D may have one or more non-planar portions, as discussed further below.

In some embodiments, when a source region S or drain region D has a single side portion for one or both side walls, the single side may be considered to be non-tapered, or straight/plate-shaped, or flat-surfaced. And, in some embodiments, when a source region S or drain region D has a multiple side portions for one or both sides, the multiple sides may form a concave, curved, angled, and/or tapered shape. To form a tapered or concave shape in the X-direction of source region S or drain region D, either one of the sides of respective source region S or drain region D may have a concave, curved, or angled shape, while the other side is flat, or both sides can have a concave, curved, or angled shape. In certain embodiments, if both sides have a concave, curved, or angled shape, the opposing sides of respective source region S or drain region D may mirror each other.

Referring to FIG. 1A, an active region 130a in accordance with certain example embodiments may be formed to have a fin shape vertically protruding from a substrate 101 (i.e., a Z-direction). The active region 130a may include a channel region C, a drain region D disposed on one side surface of the channel region C in an X direction, and a source region S disposed on the other side surface of the channel region C in the X direction.

In example embodiments, the source region S and the drain region D may be structurally symmetric. For example, each of the source region S and the drain region D may include two side surfaces which are partially tapered and mirror, or are opposing to, one another in a Y direction. For example, each of the source region S and the drain region D may have two side surfaces which, as they move toward a center in the Y direction, are partially tapered from both ends to a center in the X direction. As illustrated in FIG. 1A, each of the two opposing sides of source region S and the two opposing sides of drain region D may have multiple side portions. In the example embodiment of FIG. 1A, each side may have three side portions. In some embodiments, for certain of the mirrored side portions at source region S and the mirrored side portions at drain region D, as the side portions move toward a center in the X direction, they may also move toward a center in the Y direction.

In some embodiments, central side portions of the side surfaces of the source region S and the drain region D may be planar, such that for each opposing side of source region S and drain region D, the two side portions that are angled toward the center may connect with the planar side portion. For example, each of the side surfaces of the source region S and the drain region D may have a concave tapered shape. As a further example, upper surfaces of the drain region D and the source region S may also be tapered.

Figure 1B:
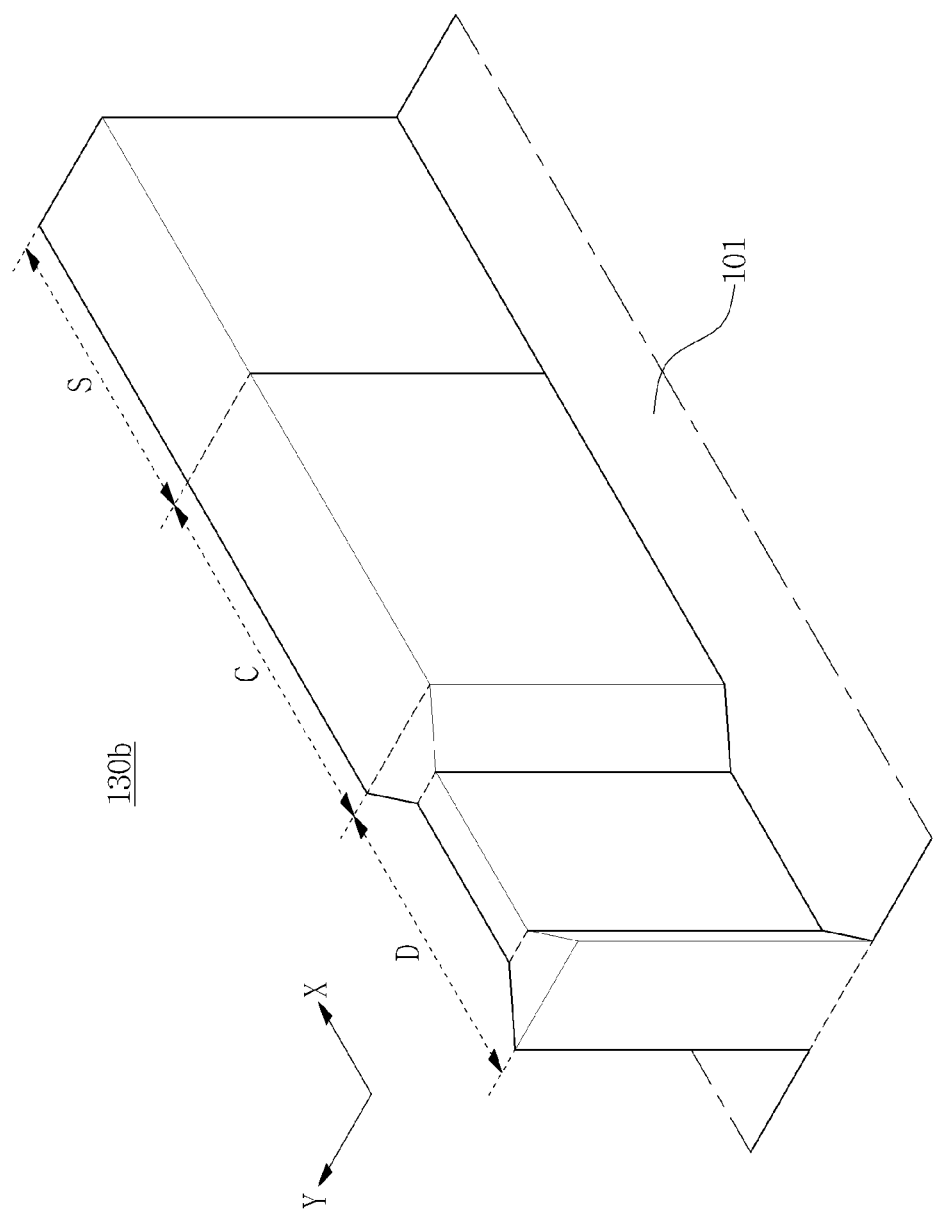

Referring to FIG. 1B, an active region 130*b* in accordance with certain example embodiments of the may include a channel region C, and a source region S and a drain region D which are disposed on opposite sides of the channel region C, and may be protruding vertically from a substrate 101 (i.e., in a Z-direction). In some embodiments, the source region S and the drain region D may be structurally asymmetric. For example, the source region S may have two planar side surfaces, and the drain region D may have two side surfaces which are opposite in a Y direction and are partially tapered in an X direction. As illustrated in FIG. 1B, each of the two side surfaces of drain region D may have multiple side portions. In some embodiments, for certain of the mirrored multiple side portions of drain region D, as the side portions, as the side portions move toward a center in an X direction, they may also move toward a center in a Y direction. In some embodiments, central side portions of the side surfaces of the drain region D may be planar, such that for each opposing side of drain region D, the two side portions that are angled toward the center may connect with the planar side portion. For example, each of the side surfaces of the drain region D may have a concave tapered shape.

Although not illustrated, in some embodiments, the shapes of the source region S and the drain region D, as illustrated in FIG. 1B, may be inverted such that the drain region D has two planar side surface, and the source region S has two non-planar side surfaces.

Figure 1C:
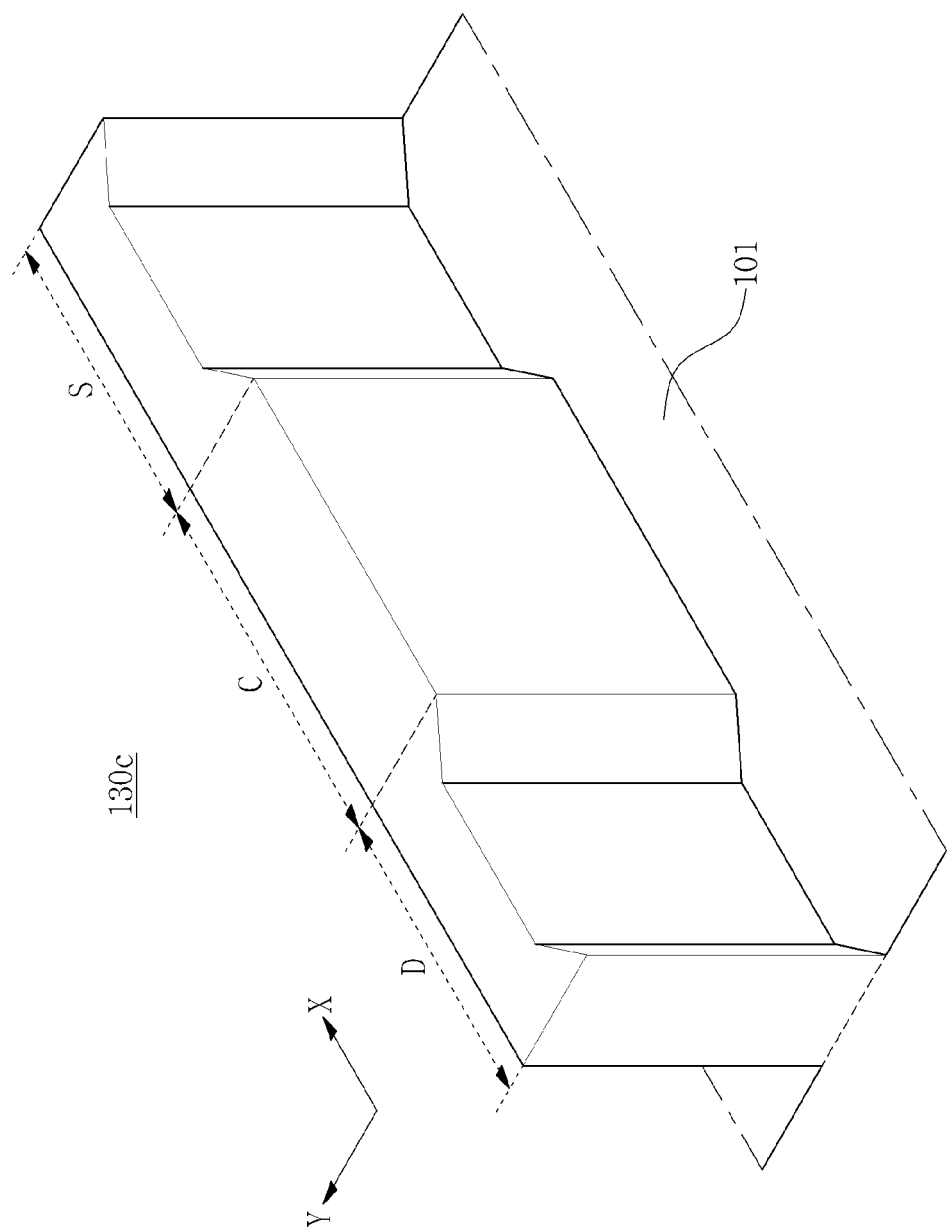

Referring to FIG. 1C, an active region 130*c* in accordance with certain example embodiments may include a channel region C, and a source region S and a drain region D which are disposed on opposite sides of the channel region C in an X-direction, and may be protruding vertically from a substrate 101 in a Z-direction. In some embodiments, each of the source region S and the drain region D may have a side surface which is perpendicular to a Y direction and is partially tapered in an X direction. The source region S and the drain region D may be structurally symmetric.

For example, each of the source region S and the drain region D may include two side surfaces. In some embodiments, one side of each of source region S and drain region D may have a planar surface, whereas the other side surface of each of source region S and drain region D may have multiple side portions that are partially tapered and mirror one another. In the example embodiment of FIG. 1C, the side of each of source region S and drain region D that has multiple side portions may have three side portions. Thus, as illustrated in FIG. 1C, each of the source region S and the drain region D may have one side surface with multiple side portions that, as certain of the multiple side portions move toward a center in the Y direction, are partially tapered from both ends to a center in the X direction.

In some embodiments, central side portions of the side surfaces of the source region S and the drain region D having multiple side portions may be planar, such that for certain sides of source region S and drain region D, the two side portions that are angled toward the center may connect with the planar side portion. For example, certain of the side surfaces of the source region S and the drain region D may have a concave tapered shape.

Referring to FIG. 1D, an active region 130*d* in accordance with certain example embodiments may include a channel region C, a source region S and a drain region D disposed on opposite sides of the channel region C, and may be protruding vertically from a substrate 101 (i.e., in a Z-direction relative to the planar surface of the substrate). In some embodiments, the drain region D may have a side surface which is perpendicular to a Y direction and is partially tapered in an X direction. The source region S and the drain region D may be structurally asymmetric.

For example, the drain region D may include two opposing side surfaces. In some embodiments, one side surface of the drain region D may have a planar surface, whereas the second side surface of the drain region D may have multiple side portions that are partially tapered and mirror one another. In the example embodiment of FIG. 1D, one side surface of the drain region D may have three side portions. Thus, as illustrated in FIG. 1D, the drain region D may have one side surface with multiple side portions that, as certain of the multiple side portions move toward a center in the Y direction, are partially tapered from both ends to a center in the X direction. In some embodiments, a central side portion of one side surface of the drain region D having multiple portions may be planar, such that for certain sides of the drain region D, the two side portions that are angled toward the center may connect with the planar side portion. For example, certain of the side surfaces of the drain region D may have a concave tapered shape.

Although not illustrated, in some embodiments, the shapes of the source region S and the drain region D, as illustrated in FIG. 1D, may be inverted such that the drain region D has two planar side surface, and the source region S has one planar side surface and one non-planar side surface.

Figure 1E:
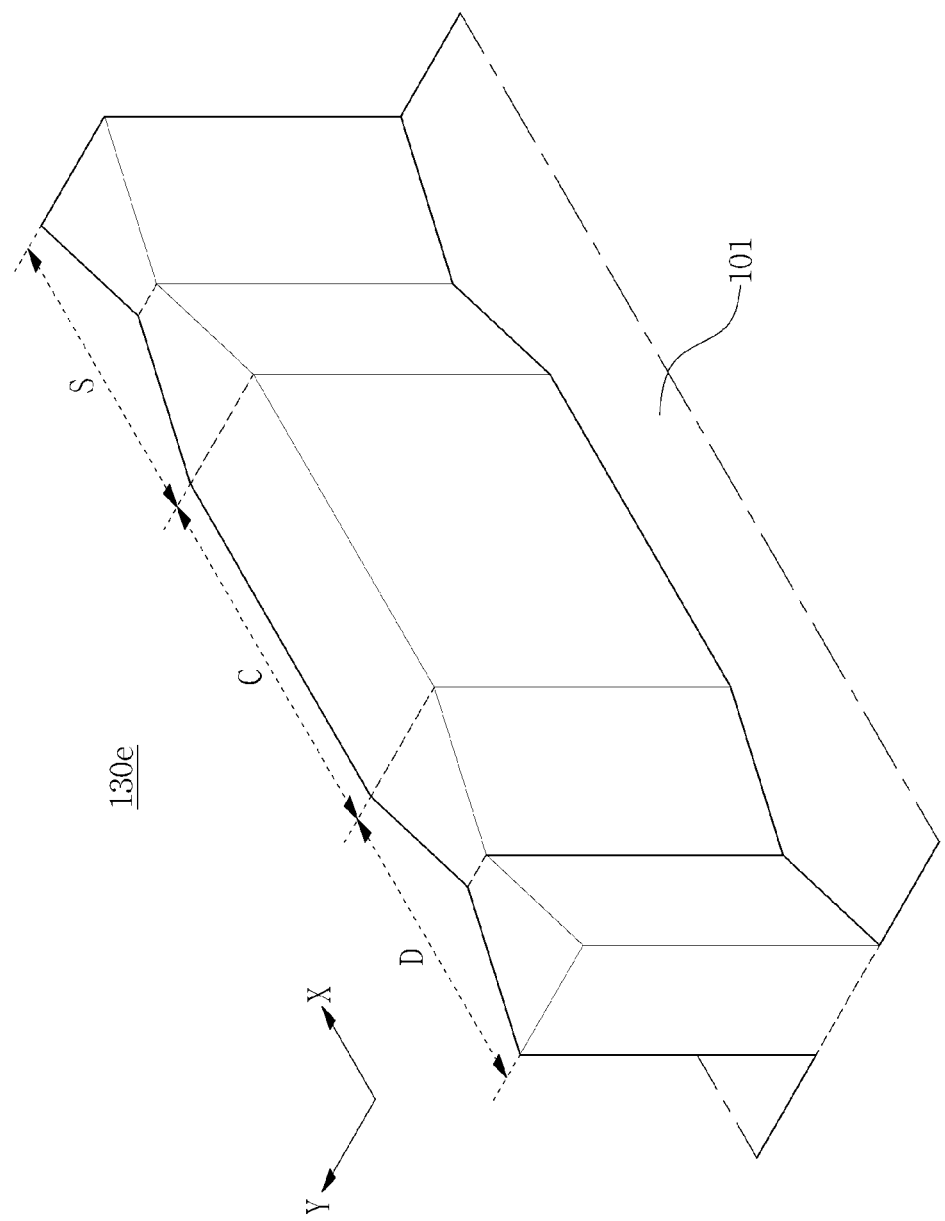

Referring to FIG. 1E, an active region 130*e* in accordance with certain example embodiments may include a channel region C, and a source region S and drain region D which are disposed on opposite sides of the channel region C, and may be protruding vertically from a substrate 101 (i.e., in a Z-direction). In some embodiments, each of the source region S and the drain region D may include side surfaces which are opposite in a Y direction and are partially tapered in both directions of an X axis. For example, each of the side surfaces of the source region S and the drain region D may be partially tapered from a center to both ends in the both directions of an X axis. The source region S and the drain region D may be structurally symmetric.

For example, each of the source region S and the drain region D may include two opposing side surfaces. In some embodiments, both of the opposing side surfaces of each of source region S and drain region D may have multiple side portions that are partially tapered and mirror one another. In the example embodiment of FIG. 1E, the opposing two side surfaces of each of source region S and drain region D may have two side portions. Thus, as illustrated in FIG. 1E, as certain of the multiple side portions move toward a center in the Y direction, are partially tapered from both ends to a center in the X direction. In some embodiments, as each of the two side portions of the two side surfaces of each of source region S and drain region D is angled toward the center, each side portion may connect with another angled side portion on the same side of the respective source region S or drain region D. For example, certain of the side surfaces of the source region S and the drain region D may have a concave tapered shape.

Figure 1F:
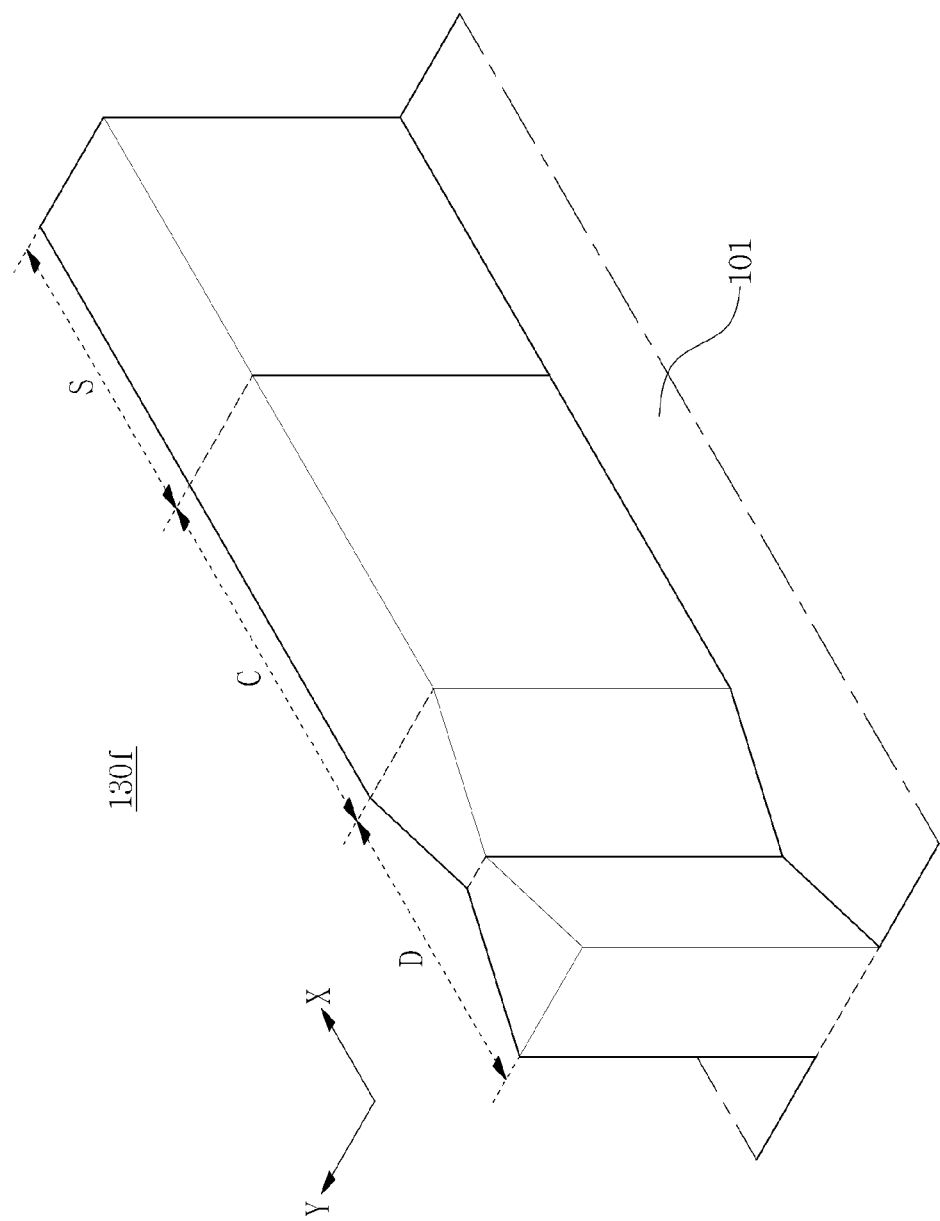

Referring to FIG. 1F, an active region 130*f* in accordance with certain example embodiments may include a channel region C, and a source region S and a drain region D which are disposed on opposite sides of the channel region C, and may be protruding vertically from a substrate 101 (i.e., in a Z-direction). In some embodiments, the drain region D may include side surfaces which are opposite in a Y direction and are tapered in both directions of an X axis. For example, the side surfaces of the drain region D may be tapered from a center to both ends in the both directions of an X axis.

In certain embodiments, each of the source region S and the drain region D may include two opposing side surfaces. In some embodiments, the two opposing side surface of source region S may be planar, whereas the two opposing side surfaces of the drain region D may have multiple side portions that are partially tapered and mirror one another. In the example embodiment of FIG. 1F, the opposing side surfaces of the drain region D may have two side portions. Thus, as illustrated in FIG. 1F, each of the two opposing side surface of the drain region D may have multiple side portions that, as certain of the multiple side portions move toward a center in the Y direction, are partially tapered from both ends to a center in the X direction. In some embodiments, as each of the two side portions of the two side surfaces of the drain region D is angled toward the center, the side portion may connect with another angled side portion on the same side of the drain region D. For example, certain of the side surfaces of the drain region D may have a concave tapered shape.

Although not illustrated, in some embodiments, the shapes of the source region S and the drain region D, as illustrated in FIG. 1F, may be inverted such that the drain region D has two planar side surface, and the source region S has two non-planar side surfaces.

Referring to FIG. 1G, an active region 130*g* in accordance with certain example embodiments may include a channel region C, and a source region S and a drain region D which are disposed on opposite sides of the channel region C, and may be protruding vertically from a substrate 101 (i.e., in a Z-direction). In some embodiments, each of the source region S and the drain region D may include surfaces perpendicular to a Y direction and one of the surfaces is tapered from a center to both ends in both directions of an X axis.

In certain embodiments, each of the source region S and the drain region D may include two opposing side surfaces. In some embodiments, one of the two opposing side surface of the source region S and the drain region D may be planar, whereas the other of the two opposing side surfaces of the source region S and the drain region D may have multiple side portions that are partially tapered and mirror one another. In the example embodiment of FIG. 1G, the side surfaces of the source region S and the drain region D having multiple portions may include two side portions. Thus, as illustrated in FIG. 1G, a certain side surface of the source region S and the drain region D may have multiple side portions that, as certain of the multiple side portions move toward a center in the Y direction, are partially tapered from both ends to a center in the X direction. In some embodiments, as each of the two side portions of the two side surfaces of the drain region D is angled toward the center, the side portion may connect with another angled side portion on the same side of the drain region D. Similarly, in some embodiments, as each of the two side portions of the two side surfaces of the source region S is angled toward the center, the side portion may connect with another angled side portion on the same side of the source region S. Thus, for example, certain of the side surfaces of the source region S and the drain region D may have a concave tapered shape.

Referring to FIG. 1H, an active region 130*h* in accordance with certain example embodiments may include a channel region C, and a source region S and a drain region D which are disposed on opposite sides of the channel region C, and may be protruding vertically from a substrate 101 (i.e., in a Z-direction). The source region S and the drain region D may be structurally asymmetric. In some embodiments, the drain region D may include surfaces perpendicular to a Y direction and one of the surfaces is tapered from a center to both ends in both directions of an X axis.

In certain embodiments, the drain region D may include two opposing side surfaces. In some embodiments, one of the two opposing side surface of the drain region D may be planar, whereas the other of the two opposing side surfaces of the drain region D may have multiple side portions that are partially tapered and mirror one another. In the example embodiment of FIG. 1H, the side surfaces of the drain region D having multiple portions may include two side portions. Thus, as illustrated in FIG. 1H, a certain side surface of the drain region D may have multiple side portions that, as certain of the multiple side portions move toward a center in the Y direction, are partially tapered from both ends to a center in the X direction. In some embodiments, as each of the two side portions of the two side surfaces of the drain region D is angled toward the center, the side portion may connect with another angled side portion on the same side of the drain region D. Thus, for example, certain of the side surfaces of the drain region D may have a concave tapered shape.

Although not illustrated, in some embodiments, the shapes of the source region S and the drain region D, as illustrated in FIG. 1H, may be inverted such that the drain region D has two planar side surface, and the source region S has one planar side surface and one non-planar side surface.

FIGS. 2A to 2H are cross-sectional top views showing finFET devices including the fin shaped active regions 130*a* to 130*h*, as shown in FIGS. 1A to 1H, respectively.

Figure 2A:
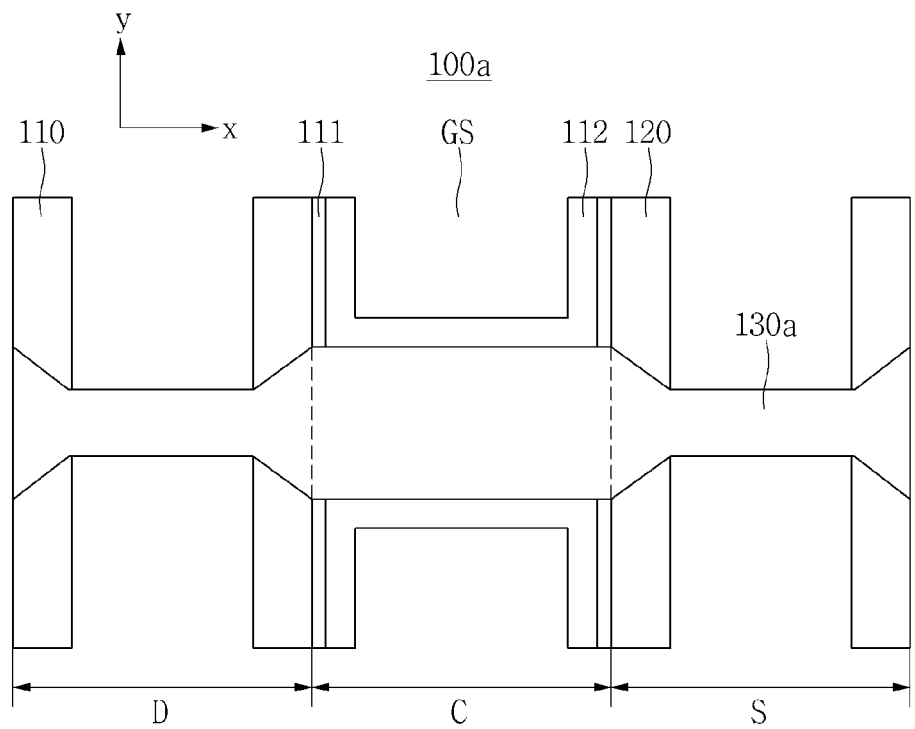
FIGS. 2A to 2H are exemplary cross-sectional views showing finFET devices using fins shown in FIGS. 1A to 1H, according to certain disclosed embodiments.

Referring to FIG. 2A, a finFET device 100*a* in accordance with certain example embodiments may include the fin-shaped active region 130*a* of FIG. 1A, drain spacers 110 formed on the tapered side surfaces of the drain region D, source spacers 120 formed on the tapered side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112.

In some embodiments, the gate insulating layer 112 may be formed directly on the channel region C. The gate insulating layer 112 may include thermally oxidized silicon or a metal oxide. For example, the gate insulating layer 112 may be formed by oxidizing a surface of the substrate 101 (as illustrated, for example, in FIGS. 1A to 1H) using a thermal oxidation process.

In some embodiments, the gate spacers 111 may be formed on outer surfaces of the gate insulating layer 112. The gate spacers 111 may include, for example, silicon nitride and/or silicon oxide.

The drain spacers 110 and/or the source spacers 120 may be formed on outer surfaces of the gate spacers 111, in some embodiments. The drain spacers 110 or the source spacers 120 may include, for example, silicon nitride and/or silicon oxide. Bottom surfaces of each of the drain spacers 110 and/or the source spacers 120 may contact the tapered side surfaces of the drain region D and/or the source region S. In some embodiments, gate electrodes may fill gate electrode spaces GS on the gate insulating layer 112.

Figure 2B:
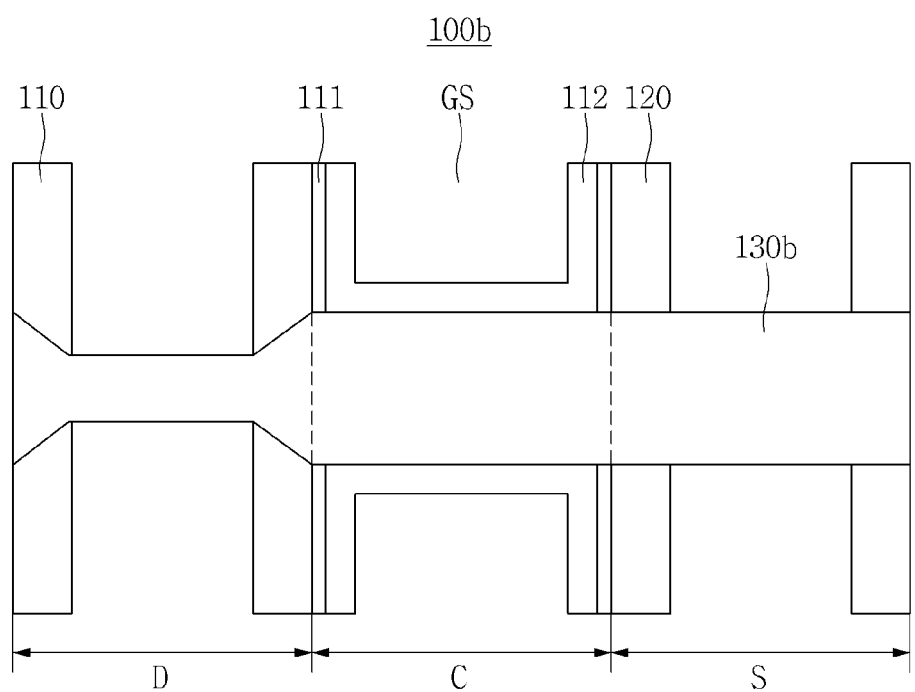

Referring to FIG. 2B, a finFET device 100b in accordance with certain example embodiments may include the fin-shaped active region 130b of FIG. 1B, drain spacers 110 formed on the tapered side surfaces of the drain region D, source spacers 120 formed on the planar side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 may be formed on the tapered side surfaces of the drain region D, and the source spacers 120 may be formed on the planar side surfaces of the source region S.

Figure 2C:
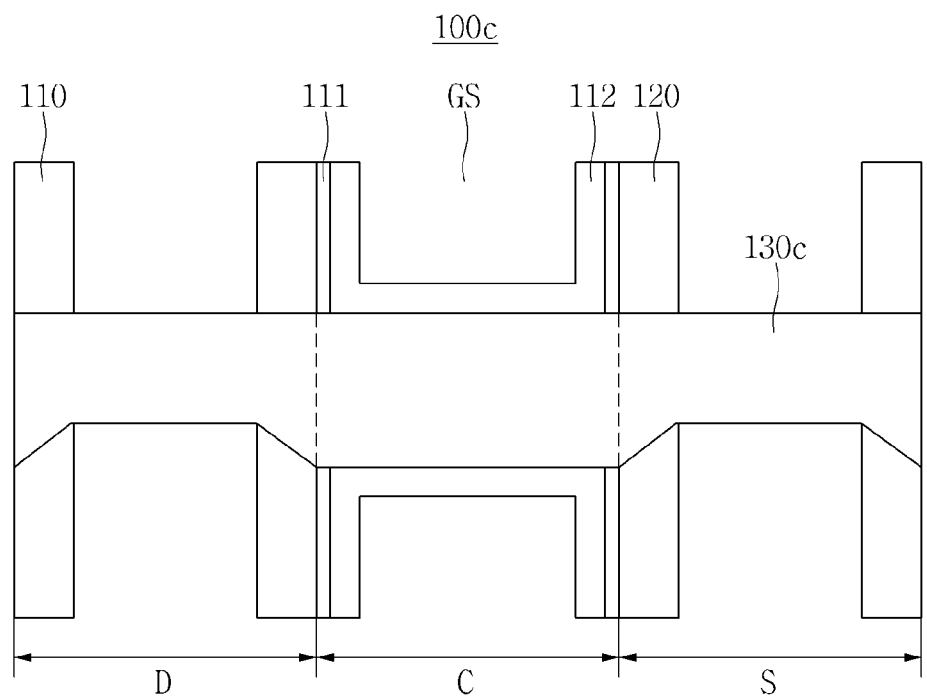

Referring to FIG. 2C, a finFET device 100c in accordance with certain example embodiments may include the fin-shaped active region 130c of FIG. 1C, drain spacers 110 formed on the side surfaces of the drain region D, source spacers 120 formed on the side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 and the source spacers 120 may be formed on the tapered side surfaces and the planar side surfaces of the drain region D and the source region S.

Figure 2D:
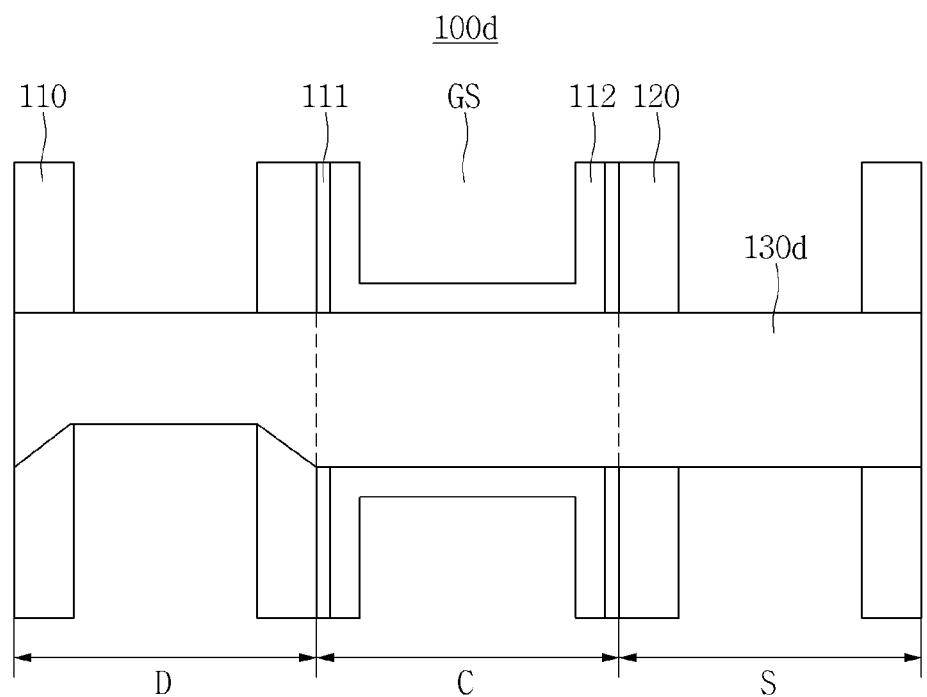

Referring to FIG. 2D, a finFET device 100d in accordance with certain example embodiments may include the fin-shaped active region 130d of FIG. 1D, drain spacers 110 formed on the side surfaces of the drain region D, source spacers 120 formed on the side surfaces of the source region S, a gate insulating layer 112 formed on the side surfaces of the channel region C, and gate spacers 111 which may contact the drain spacers 110, the source spacers 120, and the gate insulating layer 112. In some embodiments, the drain spacers 110 may be formed on the tapered side surface and the planar side surface of the drain region D and the source spacers 120 may be formed on the planar side surfaces of the source region S.

Figure 2E:
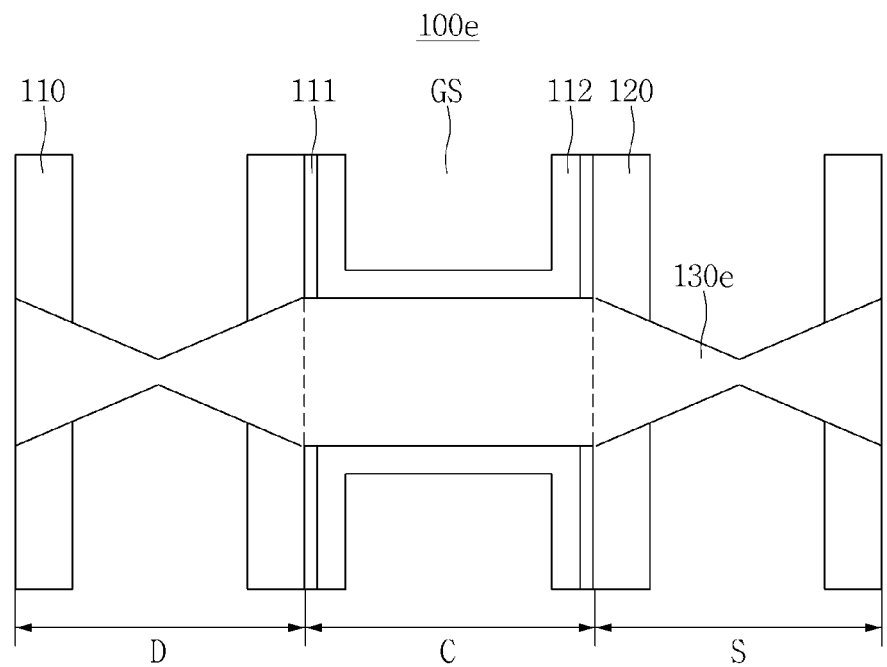

Referring to FIG. 2E, a finFET device 100e in accordance with certain example embodiments may include the fin-shaped active region 130e of FIG. 1E, drain spacers 110 formed on the side surfaces of the drain region D, source spacers 120 formed on the side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 and the source spacers 120 may be formed on the tapered side surfaces of the drain region D and the source region S.

Figure 2F:
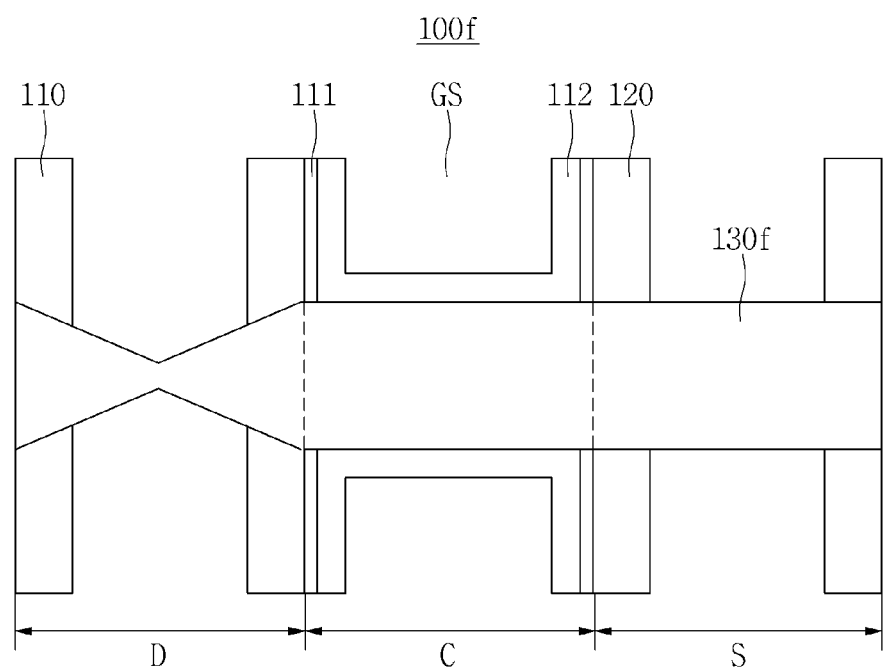

Referring to FIG. 2F, a finFET device 100f in accordance with certain example embodiments may include the fin-shaped active region 130f of FIG. 1F, drain spacers 110 formed on the side surfaces of the drain region D, source spacers 120 formed on the side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 may be formed on the tapered side surfaces of the drain region D, and the source spacers 120 may be formed on the planar side surfaces of the source region S.

Figure 2G:
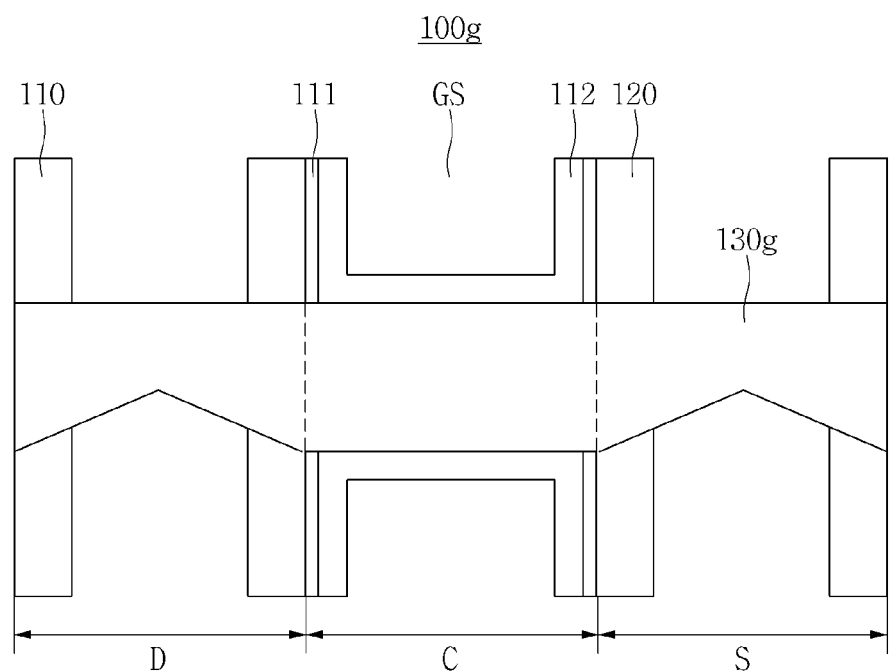

Referring to FIG. 2G, a finFET device 100g in accordance with certain example embodiments may include the fin-shaped active region 130g of FIG. 1G, drain spacers 110 formed on the side surfaces of the drain region D, source spacers 120 formed on the side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 and the source spacers 120 may be formed on the tapered side surfaces and the planar side surfaces of the drain region D and the source region S.

Figure 2H:
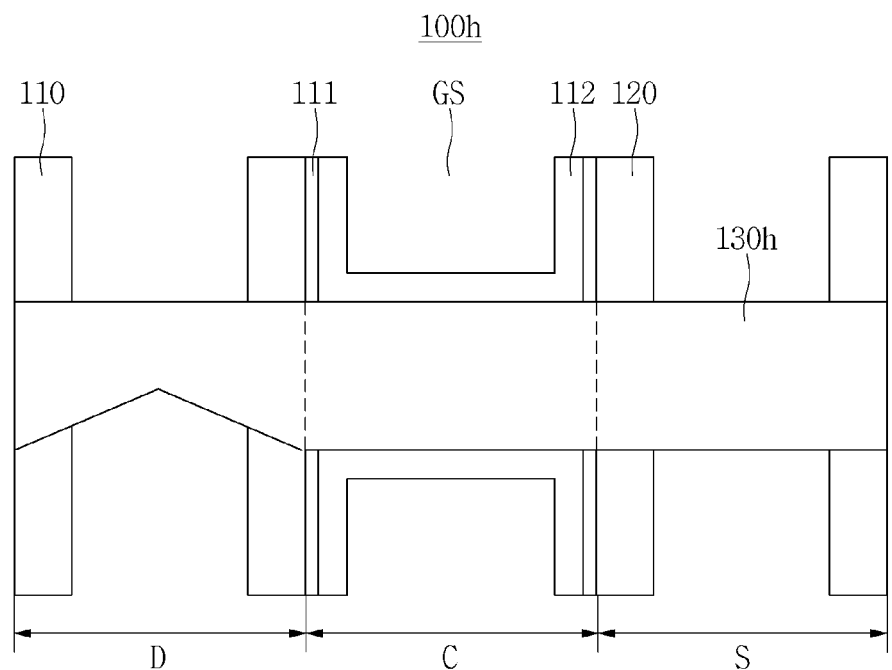

Referring to FIG. 2H, a finFET device 100h in accordance with certain example embodiments may include the fin-shaped active region 130h of FIG. 1H, drain spacers 110 formed on the side surfaces of the drain region D, source spacers 120 formed on the side surfaces of the source region S, a gate insulating layer 112 which may be formed on the side surfaces of the channel region C and may have a U-shaped cross-section, and gate spacers 111 which may contact the drain spacers 110, the source spacers 120, and the gate insulating layer 112. In some embodiments, the drain spacers 110 may be formed on the tapered side surface and the planar side surface of the drain region D, and the source spacer 120 may be formed on the planar side surfaces of the source region S.

FIGS. 3A to 3D are exemplary cross-sectional top views showing finFET devices including the fin shaped active regions 130a to 130d, as shown in FIGS. 1A to 1D.

Figure 3A:
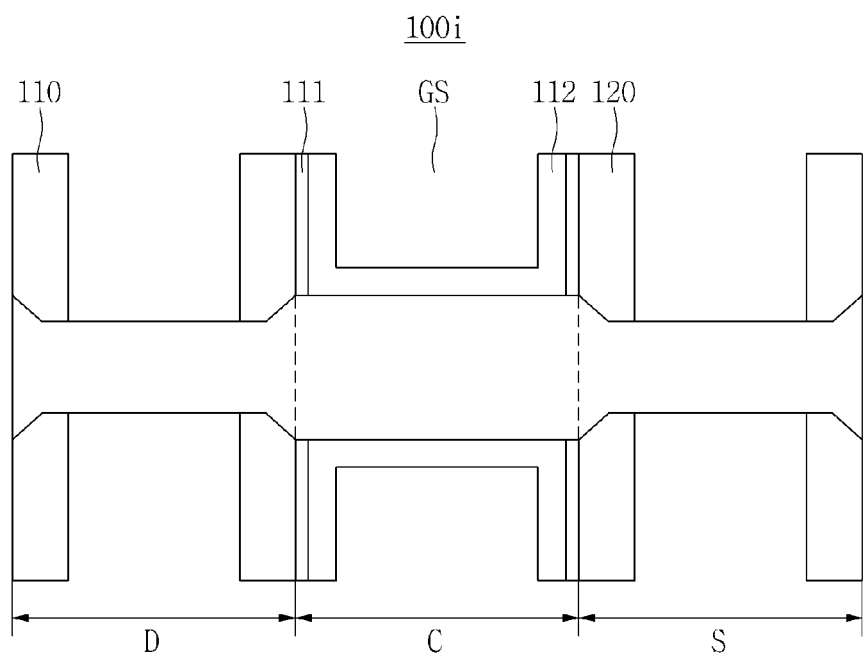
FIGS. 3A to 3D are exemplary cross-sectional views showing finFET devices, according to certain disclosed embodiments.

Referring to FIG. 3A, a finFET device 100i in accordance with certain example embodiments may include the fin-shaped active region 130a of FIG. 1A. As shown in FIG. 3A, in some embodiments, drain spacers 110 and/or source spacers 120 may be formed on tapered side surfaces of the drain region D and/or the source region S and planar side surfaces continuous with the tapered side surfaces as compared to the finFET device 100a of FIG. 2A.

Figure 3B:
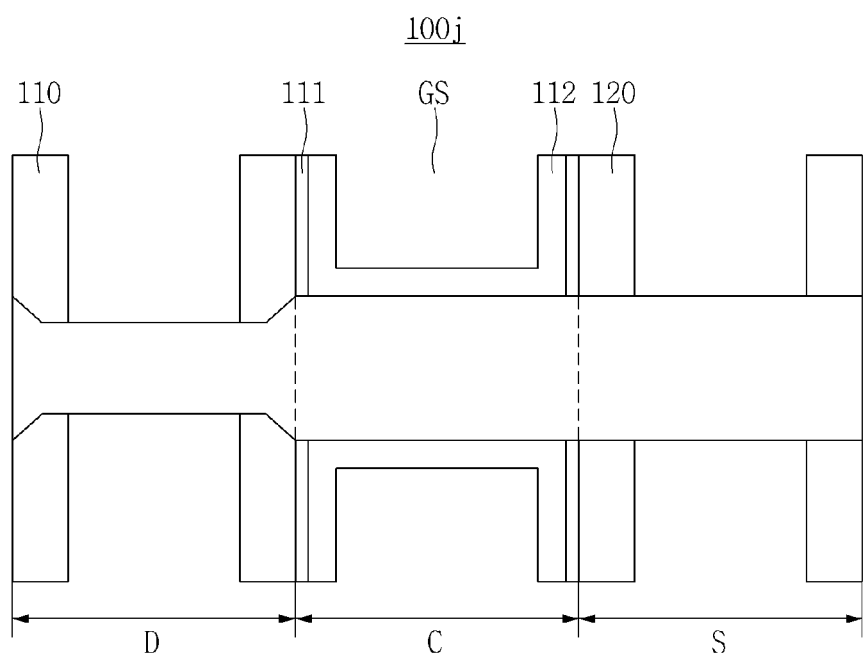

Referring to FIG. 3B, a finFET device 100j in accordance with certain example embodiments may include the fin-shaped active region 130b of FIG. 1B. As shown in FIG. 3B, in some embodiments, drain spacers 110 may contact tapered side surfaces of the drain region D and planar side surfaces continuous with the tapered side surfaces as compared to the finFET device 100b of FIG. 2B. Source spacers 120 may be formed on planar side surfaces of the source region S.

Figure 3C:
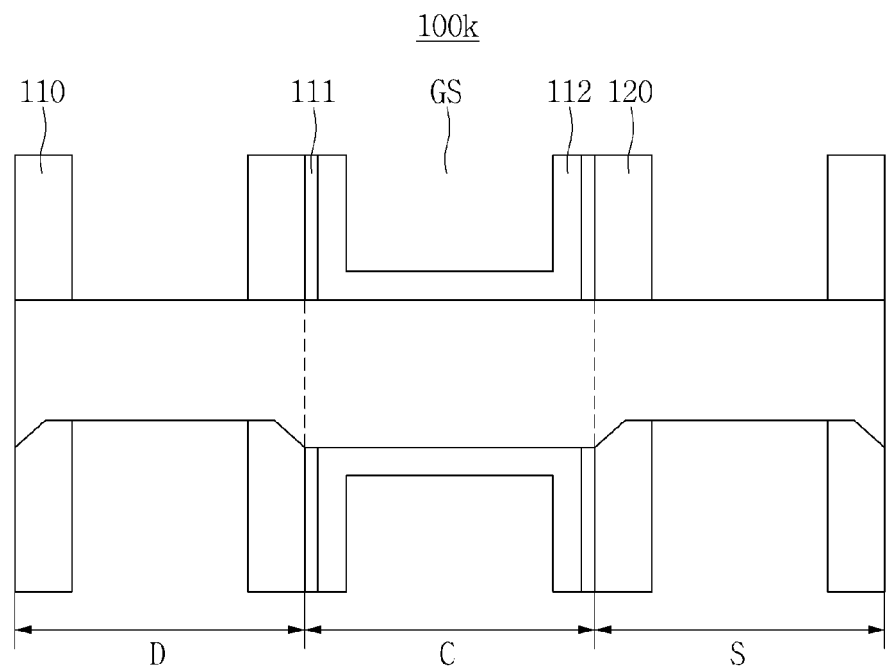

Referring to FIG. 3C, a finFET device 100k in accordance with certain example embodiments may include the fin-shaped active region 130c of FIG. 1C. As shown in FIG. 3C, in some embodiments, drain spacers 110 and/or source spacers 120 may be formed on tapered side surfaces of the drain region D and/or the source region S, planar side surfaces continuous with the tapered side surfaces, and opposing planar side surfaces as compared to the finFET device 100c of FIG. 2C.

Figure 3D:
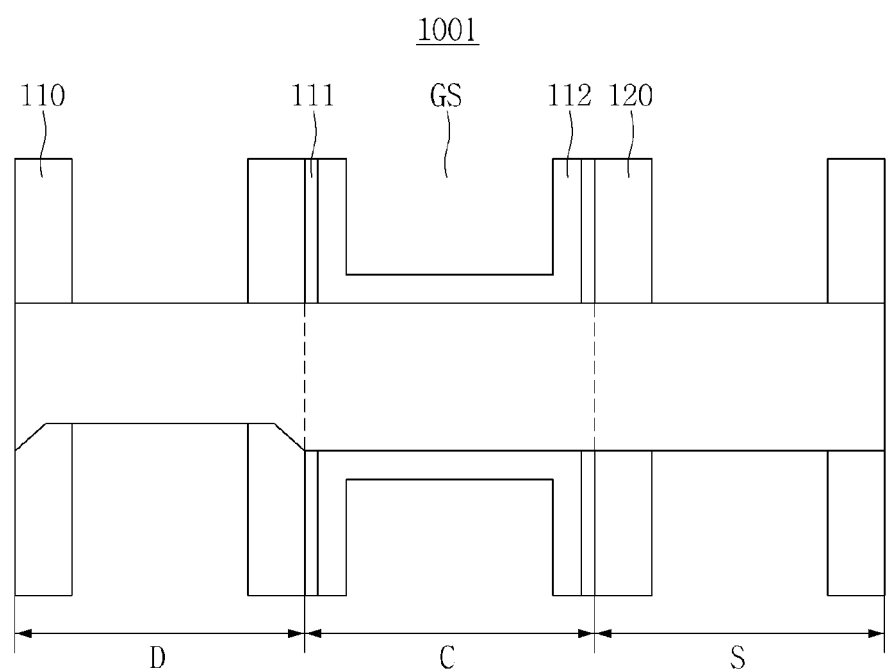
Figure 4A:
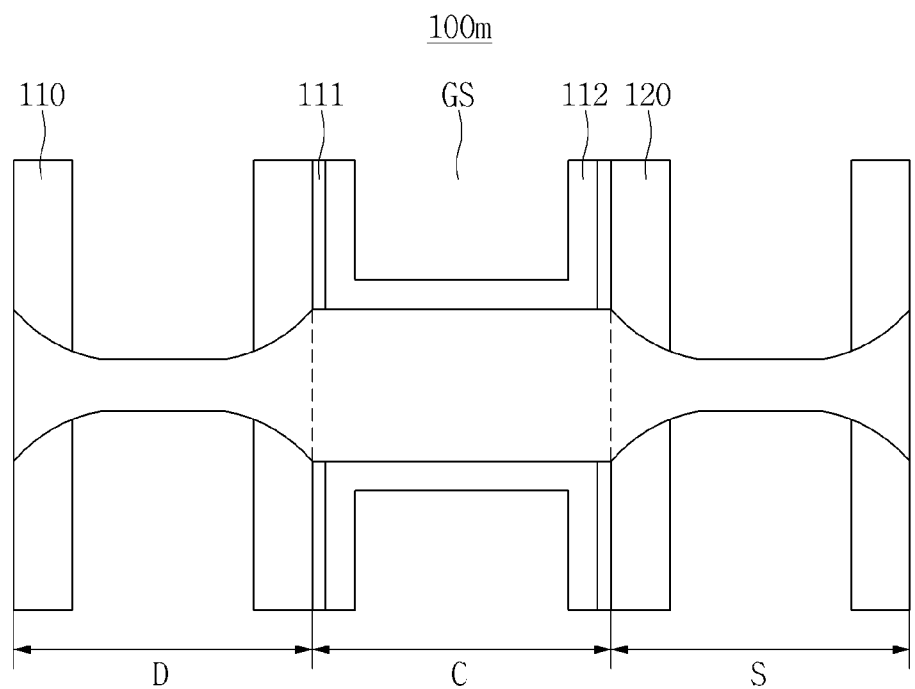
FIGS. 4A to 4D are exemplary cross-sectional views showing finFET devices, according to certain disclosed embodiments.
Figure 4B:
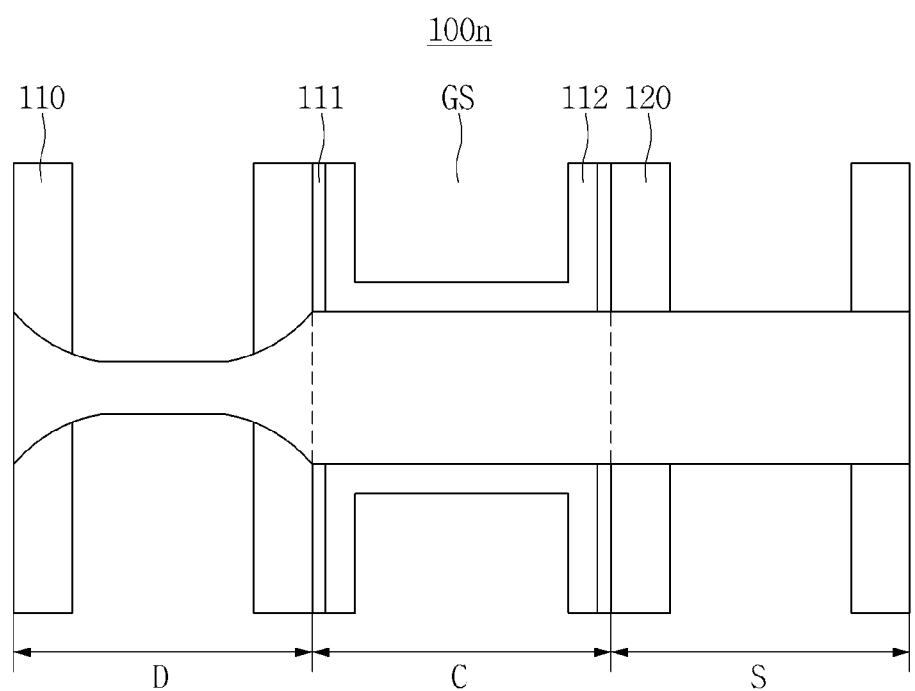
Figure 4C:
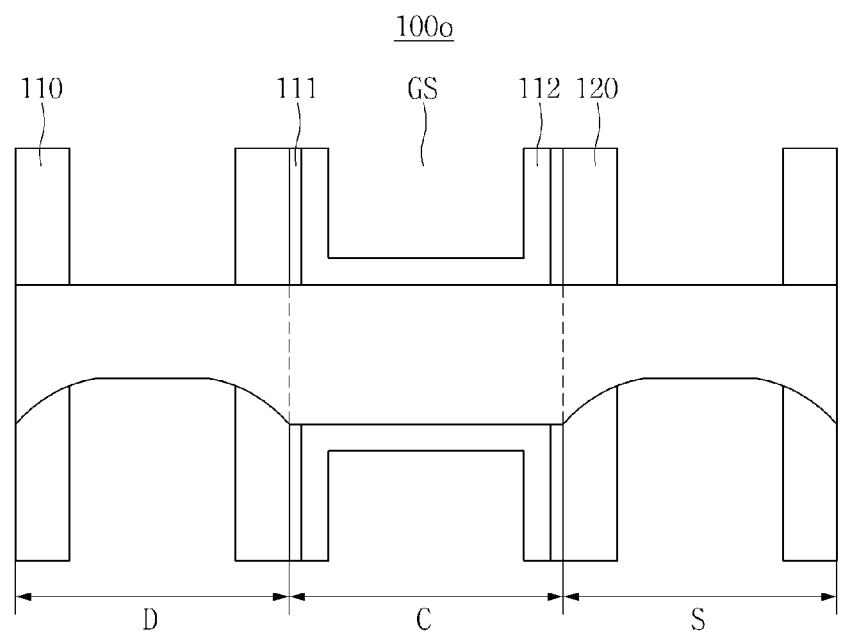
Figure 4D:
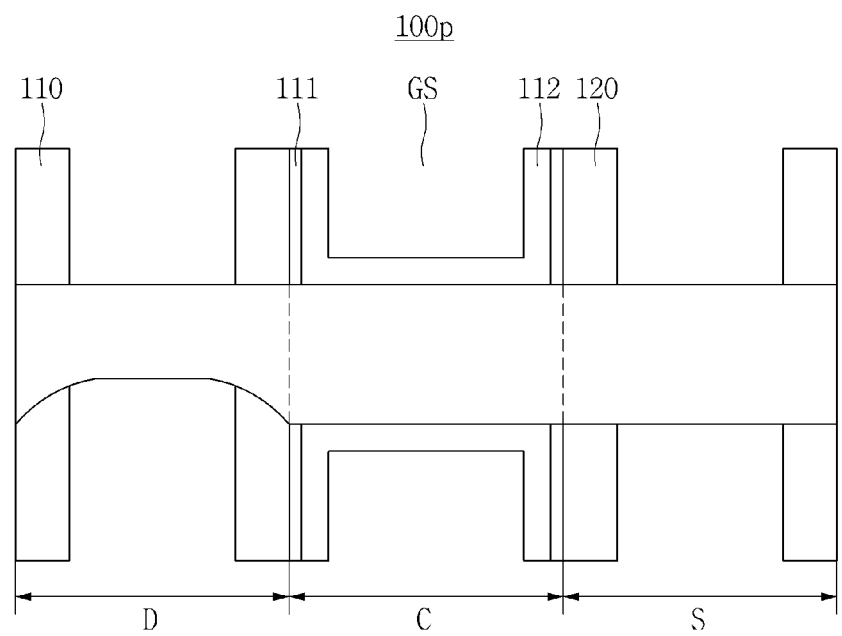

Referring to FIG. 3D, a finFET device 100l in accordance with certain example embodiments may include the fin-shaped active region 130d of FIG. 1D. As shown in FIG. 3D, in some embodiments, drain spacers 110 may be formed on tapered side surfaces of the drain region D, planar side surfaces continuous with the tapered side surfaces, and opposing planar side surfaces as compared to the finFET device 100d of FIG. 2D. Source spacers 120 may be formed on planar side surfaces of the source region S.

FIGS. 4A to 4D are exemplary cross-sectional top views showing finFET devices 100m to 100p, according to various disclosed embodiments. The finFET devices 100m to 100p may be understood with further reference to the fin-shaped active regions 130a to 130d, as illustrated in FIGS. 1A to 1D, and the finFET devices 100a to 100d, as illustrated in FIGS. 2A to 2D.

Referring to FIGS. 4A to 4D, the finFET devices 100m to 100p according to some embodiments may have one or more concave, rounded and tapered surfaces, for example, curved surfaces and planar surfaces as compared to the fin-shaped active regions 130a to 130d, as illustrated in FIGS. 1A to 1D, and the finFET devices 100a to 100d, as illustrated in FIGS. 2A to 2D.

Planar Quantum Well (QW) Field-Effect Transistor (FET)

Figure 5A:
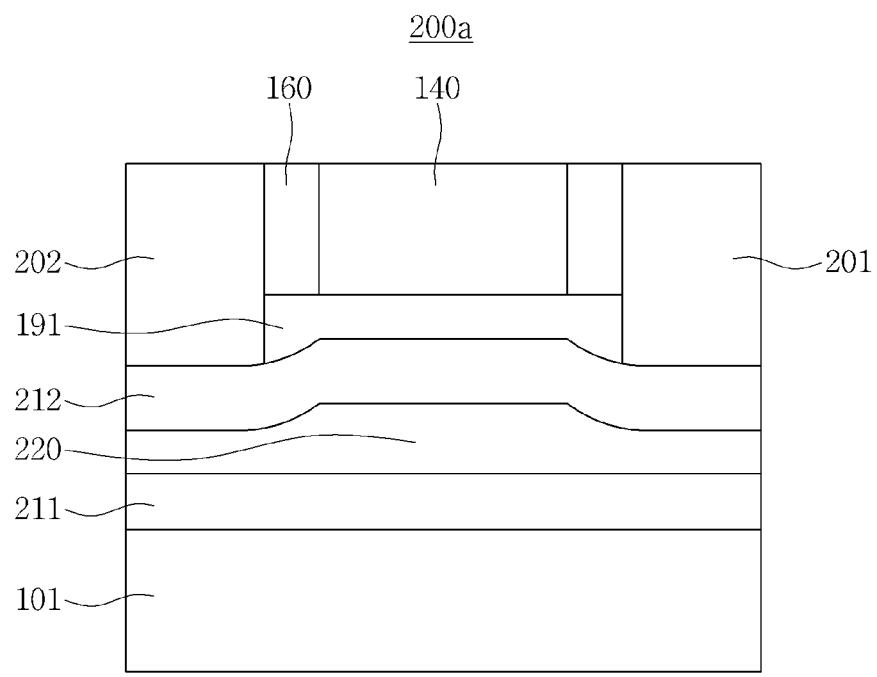
FIGS. 5A and 5B are exemplary longitudinal-sectional views showing metal-oxide-semiconductor field-effect transistor (MOSFET) devices, according to certain disclosed embodiments.

Referring to FIG. 5A, a semiconductor device 200a in accordance with certain example embodiments may include a first barrier layer 211 formed on a substrate 101, a channel region 220 formed on the first barrier layer 211, a second barrier layer 212 formed on the channel region 220, a gate insulating layer 191 formed on at least a portion of the second barrier layer 212, and a gate electrode 140 formed on at least a portion of the gate insulating layer 191.

In some embodiments, the semiconductor device 200a may include spacers 160 which may surround two or more side surfaces of the gate electrode 140, and which may be formed vertically on at least a portion of the gate insulating layer 191. And, in some embodiments, the semiconductor device 200a may include a drain electrode contact 201 and a source electrode contact 202, each of which may contact outer surfaces of the spacers 160 and outer surfaces of the gate insulating layer 191. Lower surfaces of the drain electrode contact 201 and the source electrode contact 202 may contact at least a portion of the second barrier layer 212. In some embodiments, the channel region 220 may include quantum wells.

In some embodiments, upper surfaces of regions of the channel region 220 which do not overlap surfaces of the gate electrode 140, but which vertically extend thereunder, may be tapered. The tapered upper surfaces may have, for example, concave curved surfaces. The upper surfaces of the regions of the channel region 220 which do not vertically overlap the gate electrode 140 may be located at a level lower than an upper surface of a region which vertically overlaps the gate electrode 140. Thicknesses of the regions of the channel region 220 which do not vertically overlap the gate electrode 140 may be gradually decreased toward both ends.

The second barrier layer 212 may uniformly cover the whole channel region 220. Therefore, the second barrier layer 212 may have concave surfaces formed along the tapered surfaces of the channel region 220. Upper surfaces of regions of the second barrier layer 212 which do not vertically overlap the gate electrode 140 may be located, for example, at a level lower than the upper surface of the region which vertically overlaps the gate electrode 140. In some embodiments, thicknesses of the regions of the second barrier layer 212 which do not vertically overlap the gate electrode 140 may be the same as that of the region which vertically overlaps the gate electrode 140.

The gate insulating layer 191 may be formed on the curved surfaces of the second barrier layer 212 and thus a part of a lower surface thereof may have a curved surface. Lower surfaces of regions of the gate insulating layer 191 which do not vertically overlap the gate electrode 140 may be located at a level lower than a lower surface of a region which vertically overlaps the gate electrode 140.

A lower surface of the drain electrode contact 201 and a lower surface of the source electrode contact 202 may have curved surfaces formed along the curved upper surfaces of the second barrier layer 212.

Figure 5B:
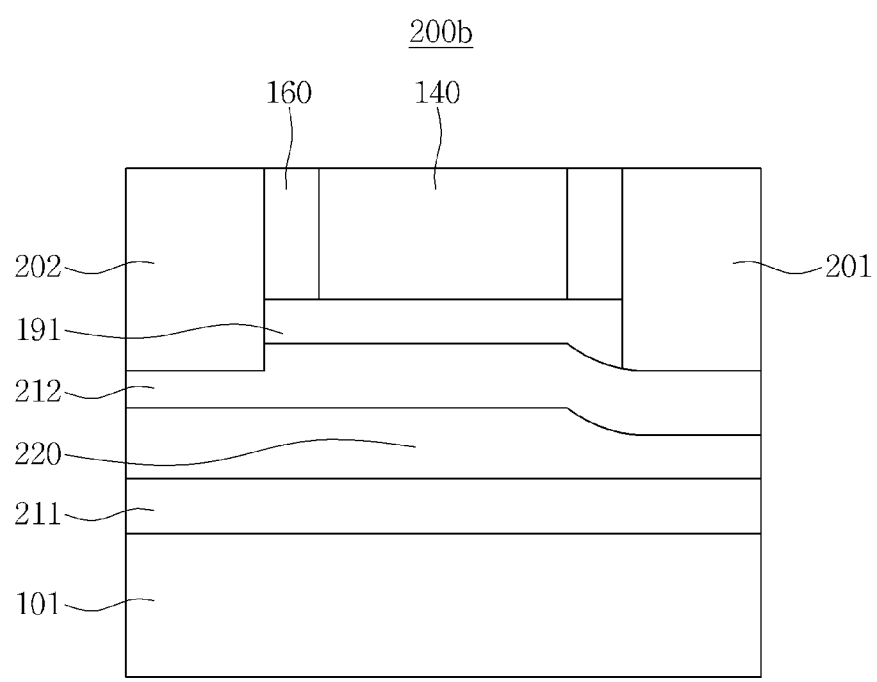

Referring to FIG. 5B, a semiconductor device 200b in accordance with certain example embodiments may include a channel region 220 having a quantum well. In some embodiments, an upper surface of one of two regions of the channel region 220 which do not vertically overlap the gate electrode 140 may be tapered. The tapered upper surface may have a curved surface. The upper surface of one of two regions of the channel region 220 which do not vertically overlap the gate electrode 140 may be located at a level lower than an upper surface of a region which vertically overlaps the gate electrode 140. In certain embodiments, a thickness of one of two regions of the channel region 220 may be gradually decreased toward an end.

The second barrier layer 212 may uniformly cover the whole channel region 220. Therefore, the second barrier layer 212 may have curved surfaces formed along the tapered surface of the channel region 220. An upper surface of one of the two regions of the second barrier layer 212 which do not overlap surfaces of the gate electrode 140, but which vertically extends thereunder, may be located at a level lower than an upper surface of a region which vertically overlaps the gate electrode 140.

In some embodiments, the gate insulating layer 191 may be formed on the curved surface of the second barrier layer 212 and thus a part of a lower surface thereof may have a curved surface. A lower surface of one of the two regions of the gate insulating layer 191 which do not vertically overlap the gate electrode 140 may be located at a level lower than a lower surface of a region which vertically overlaps the gate electrode 140.

The drain electrode contact 201 may be formed on the curved surface. In some exemplary embodiments, a lower surface of the drain electrode contact 201 may have a curved surface formed along a curve of the upper surface of the second barrier layer 212.

The various embodiments described herein can be described in different ways. For example, referring to the above-described figures, the disclosed embodiments may include a finFET device having a substrate with a protruding active region. For example, the active region may be disposed above or as part of the substrate (i.e., deposited on the substrate, etched into the substrate, etc.). The active region may include, for example, a channel region having a first boundary and a second boundary. The first and second boundaries may be disposed at opposite ends of the channel region, each having a boundary width. In some embodiments, the first boundary may have a first boundary width and the second boundary may have a second boundary width, both measured in a first direction. The first boundary width may be the same as the second boundary width. The active region may also include a first source/drain region that is adjacent to the first boundary of the channel region, and a second source/drain region that is adjacent to the second boundary of the channel region.

In some embodiments, each of the first source/drain region and the second source/drain region may extend in a second direction, which is perpendicular to the first direction. The first source/drain region may have a first side surface and a second side surface that is opposite the first side surface, and the first side surface and second side surface may each extend from the first boundary to an end of the first source/drain region. The first side surface may be opposite to the second side surface in the first direction that is perpendicular to the second direction. In addition, in some embodiments, the second source/drain region may have a third side surface and a fourth side surface that is opposite the third side surface, and the third side surface and fourth side surface may each extend from the second boundary to an end of the second source/drain region. The third side surface may be opposite to the fourth side surface in the first direction that is perpendicular to the second direction.

The first source/drain region may include a first tapered region that tapers between the first side surface and the second side surface as the first tapered region extends away from the first boundary, and a second tapered region that tapers between the first side surface and the second side surface as the second tapered region extends away from the end of the first source/drain region. The first tapered region may be directly adjacent to the second tapered region or the first tapered region and the second tapered region may be separated by a central region. For example, in some embodiments, the first side surface of the first source/drain region may have a first surface portion shaped to form a first tapered region between the first side surface and the second side surface such that the first tapered region tapers from the first boundary to a central region of the first source/drain region, and a second surface portion shaped to form a second tapered region between the first side surface and the second side surface such that the second tapered region tapers from the end of the first source/drain region to the central region. In some embodiments, the central region may not be tapered. In certain embodiments, a width at the central region may be smaller than a width at the end of the first source/drain region and/or a width at the first boundary. The width may be the distance between the first side surface and the second side surface.

One or both of the first side surface and the second side surface of the first source/drain region may have a concave shape thus forming a concave surface. For example, one or both of the first side surface and the second side surface may include a concave curved shape. Alternatively, one or both of the first side surface and the second side surface may have a concave angled shape, for example having two or three planar portions that together form a concave shape. Each of the first side surface an second side surface may be formed in portions, for example, two planar portions having two different planar orientations, three planar portions having three different planar orientations, two curved portions and one straight portion therebetween, etc., as can be seen in the various figures.

The second source/drain region may include a third tapered region that tapers between the third side surface and the fourth side surface as the third tapered region extends away from the second boundary, and a fourth tapered region that tapers between the third side surface and the fourth side surface as the fourth tapered region extends away from the end of the second source/drain region. The third tapered region may be directly adjacent to the fourth tapered region or the third tapered region and the fourth tapered region may be separated by a central region. In some embodiments, the central region may not be tapered. In certain embodiments, a width at the central region may be smaller than a width at the end of the second source/drain region and/or a width at the second boundary. The width may be the distance between the third side surface and the fourth side surface.

One or both of the first side surface and the second side surface of the second source/drain region may have a concave shape thus forming a concave surface. For example, one or both of the first side surface and the second side surface may include a concave curved shape. Alternatively, one or both of the first side surface and the second side surface may have a concave angled shape, for example having two or three planar portions that together form a concave shape. Each of the first side surface an second side surface may be formed in portions, for example, two planar portions having two different planar orientations, three planar portions having three different planar orientations, two curved portions and one straight portion therebetween, etc., as can be seen in the various figures.

As used herein, the terms "concave" or "concave-shaped" are used to describe any inwardly-formed shape including, for example, symmetrical and asymmetrical shapes that may be curved, angular, squared, v-shaped, etc.

Referring to FIG. 5A, a method of manufacturing a semiconductor device in accordance with certain example embodiments may include preparing the substrate 101, and forming the first barrier layer 211 on the substrate 101. The substrate 101 may be a silicon substrate or a silicon on insulator (SOI) substrate. The first barrier layer 211 may be formed of a buffer material or may include the buffer material. The buffer material may be, for example, a $Si_{1-x}Ge_x$ material. However, the buffer material is not limited thereto, and for example, may be a material including an IV group, III-V group, or II-VI group heterostructure.

The method may include forming the channel region 220 having the quantum wells on the first barrier layer 211. The channel region 220 may include germanium (Ge) or silicon germanium (SiGe).

In some embodiments, the method may include tapering the upper surfaces of the regions of the channel region 220, which are to be formed later and do not vertically overlap the gate electrode 140. The tapered upper surfaces may have, for example, curved surfaces. The method may include masking the upper surfaces of the regions of the channel region 220, which are to be formed later and vertically overlap the gate electrode 140, before the tapering process is performed, and the tapering process may include a plasma etching process.

Referring to FIG. 5B, in some embodiments, the method may include tapering the upper surface of one of two regions of the channel region 220, which are to be formed later and do not vertically overlap the gate electrode 140. The tapered upper surface may have, for example, a curved surface. The method may include masking the upper surface of the region of the channel region 220, which is to be formed later and vertically overlaps the gate electrode 140, before the tapering process is performed. In some embodiments, the tapering process may include a plasma etching process.

Referring to FIGS. 5A and 5B, in some exemplary embodiments, the method may include forming the second barrier layer 212 on the channel region 220 to have a uniform thickness. The second barrier layer 212 may be formed of a buffer material or may include the buffer material. The buffer material may be, for example, a $Si_{1-x}Ge_x$ alloy material. However, the buffer material is not limited thereto, and for example, may be a material including an IV group, III-V group, or II-VI group heterostructure. The channel region 220 may include the quantum wells. The method may include forming the gate insulating layer 191 on the second barrier layer 212.

For example, the gate insulating layer 191 may be formed of a material having a dielectric constant greater than or equal to that of silicon dioxide ($SiO_2$), and may be formed by a chemical vapor deposition (CVD) process, an atomic layer deposition (ALD) process, a blanket deposition process and/or other suitable deposition processes such as a growth, deposition, or forming process.

Additionally, in some embodiments, the method may include forming a spacer layer on the gate insulating layer 191. The spacer layer may include, for example, a dielectric such as silicon nitride ($Si_3N_4$), silicon dioxide ($SiO_2$), and/or various other suitable semiconductor device spacer materials. In certain embodiments, the spacer layer may be etched in order to ensure thicknesses and widths of the gate electrode 140, a source electrode contact 202, and a drain electrode contact 201 which are to be formed later, and may be spacers 160 after the etching. The etching process may be performed until the gate insulating layer 191 is exposed.

In some embodiments, the method may include forming the gate electrode 140 between the spacers 160. For example, the gate electrode 140 may be formed of tantalum, tungsten, tantalum nitride, and/or titanium nitride.

Nanowire FET

Figure 6A:
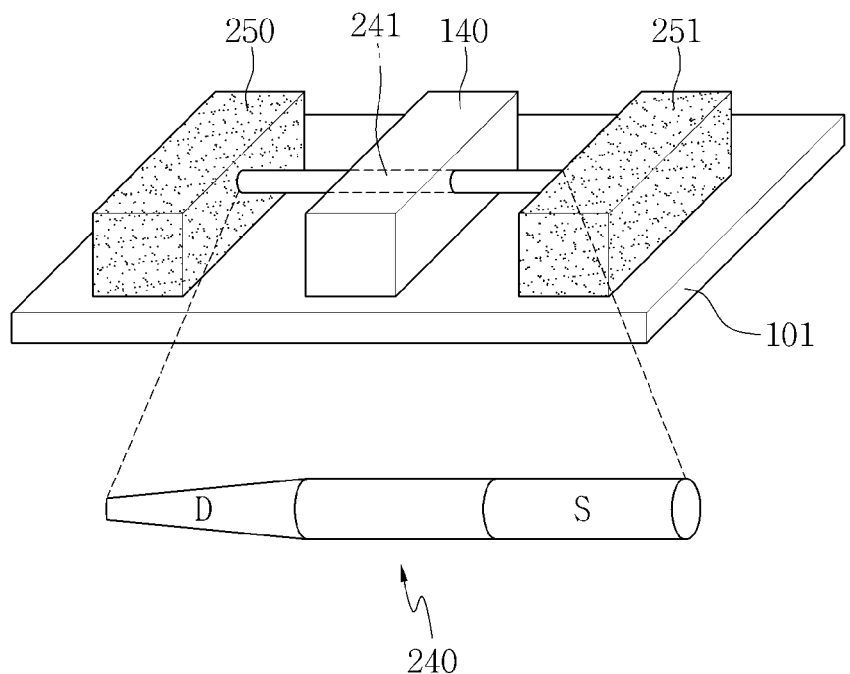
FIGS. 6A and 6B are exemplary perspective views showing MOSFET devices, according to certain disclosed embodiments.

Referring to FIG. 6A, a semiconductor device 300a in accordance with certain example embodiments may include a horizontal nanowire 240. The semiconductor device 300a may include a first SiGe bulk body 250 formed on a substrate 101, a gate pattern 140 horizontally spaced apart from the first SiGe bulk body 250, and a second SiGe bulk body 251 horizontally spaced apart from the gate pattern 140. In some embodiments, conductive impurities may be implanted into the first SiGe bulk body 250 and the second SiGe bulk body 251, and thus the first SiGe bulk body 250 and the second SiGe bulk body 251 may be provided as a drain region and a source region, respectively. The semiconductor device 300a may include one or more nanowires 240 which horizontally pass through the first SiGe bulk body 250, the gate pattern 140, and the second SiGe bulk body 251, and the nanowire 240 may include a channel region 241. In certain embodiments, the nanowire 240 may include a drain region D which horizontally passes through the first SiGe bulk body 250, a channel region 241 which passes through the gate pattern 140, and a source region S which passes through the second SiGe bulk body 251. The drain region D of the nanowire 240 may have a tapered surface. For example, the drain region D of the nanowire 240 may be tapered from the channel region 241 to an end.

Figure 6B:
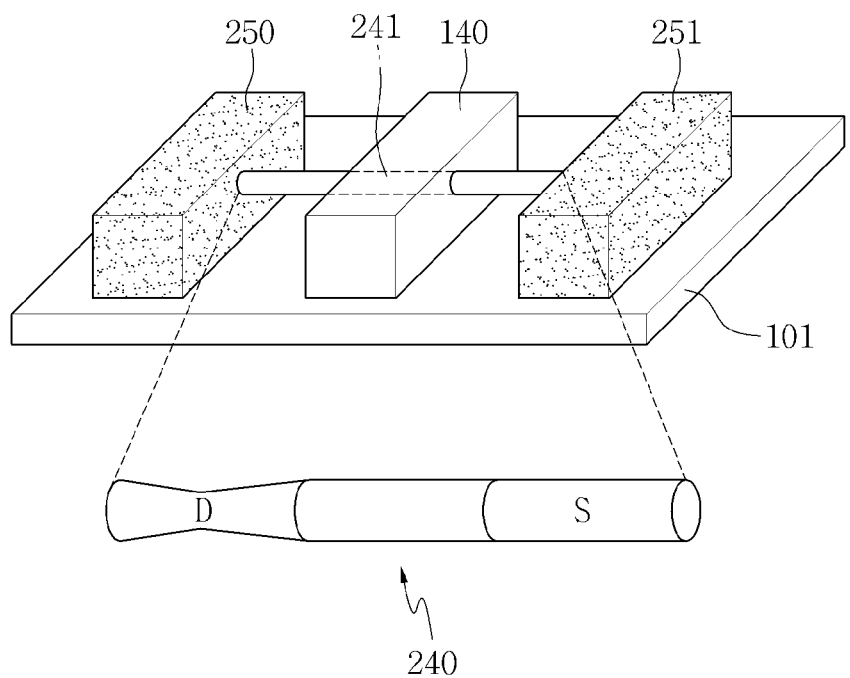

Referring to FIG. 6B, a semiconductor device 300b in accordance with certain example embodiments may include a drain region D of a nanowire 240 having a concave tapered surface.

Figure 7:
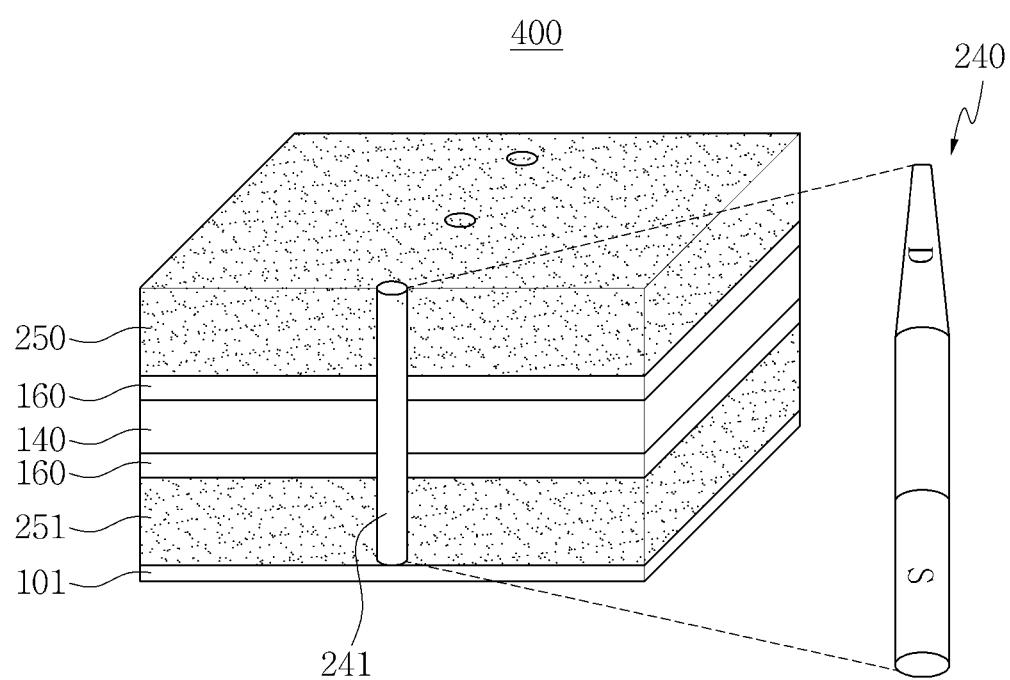
FIG. 7 is an exemplary perspective view showing MOSFET devices, according to certain disclosed embodiments.

Referring to FIG. 7, a semiconductor device 400 in accordance with certain example embodiments may include a vertical nanowire 240. In some embodiments, the semiconductor device 400 may include a lower SiGe bulk body 251 formed on a substrate 101, a gate pattern 140 formed on the lower SiGe bulk body 251, and an upper SiGe bulk body 250 formed on the gate pattern 140.

Spacers 160 may be formed between the gate pattern 140 and the upper SiGe bulk body 250, and between the gate pattern 140 and the lower SiGe bulk body 251. In certain exemplary embodiments, conductive impurities may be implanted into the upper SiGe bulk body 250 and the lower SiGe bulk body 251, and thus the upper SiGe bulk body 250 and the lower SiGe bulk body 251 may be provided as a drain region and a source region, respectively. The semiconductor device 400 may include one or more nanowires 240 which vertically pass through the upper SiGe bulk body 250, the gate pattern 140, and the lower SiGe bulk body 251, and the nanowire 240 may include a channel region 241. In some embodiments, the nanowires 240 may include a drain region D which vertically passes through the upper SiGe bulk body 250, a channel region 241 which vertically passes through the gate pattern 140, and a source region S which vertically passes through the lower SiGe bulk body 251. As illustrated in the example embodiment of FIG. 7, a diameter of the drain region D may decrease as the drain region D extends further away from a gate.

Diagrams

Figure 8A:
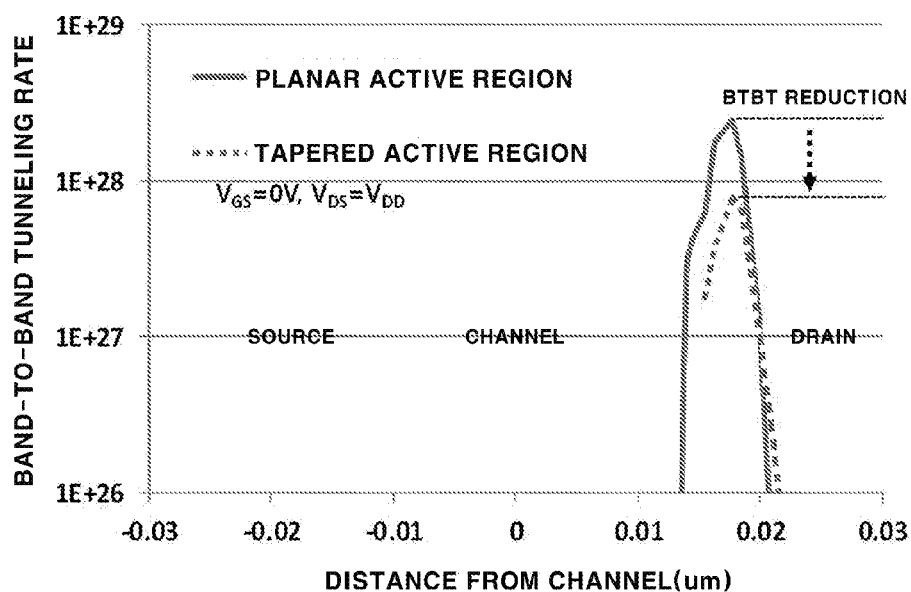
FIGS. 8A and 8B are exemplary graphs showing effects, such as those derived from certain disclosed embodiments.
Figure 8B:
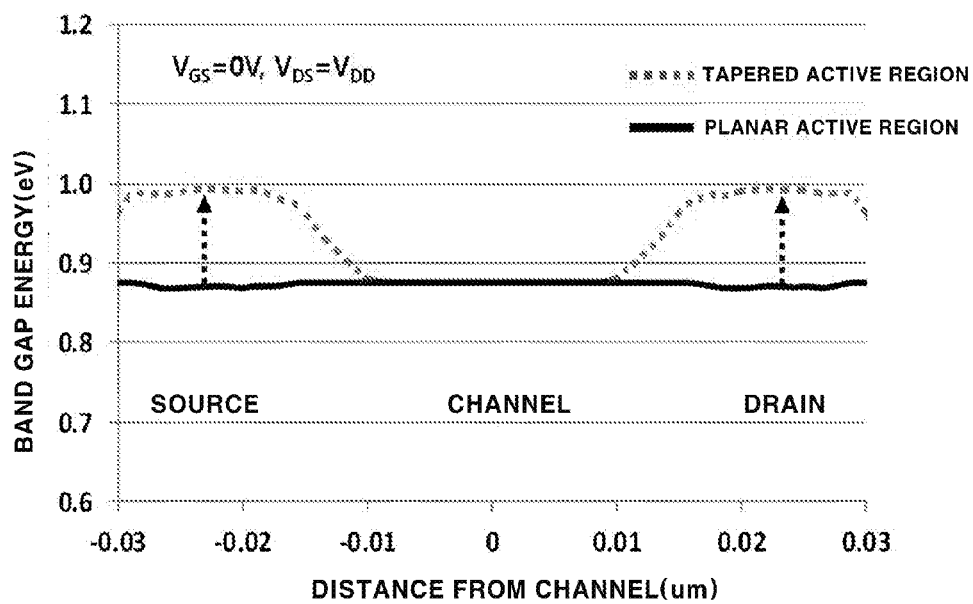

FIGS. 8A and 8B are exemplary graphs showing effects, such as those derived from certain disclosed embodiments. Referring to FIG. 8A, for example, when a band gap is expanded in a tapered region, band-to-band leakage current in a device may be reduced. Referring to FIG. 8B, as another example, in a region in which band-to-band tunneling (BTBT) is a maximum value, the band gap is locally increased, and thus the BTBT may be reduced.

Figure 9A:
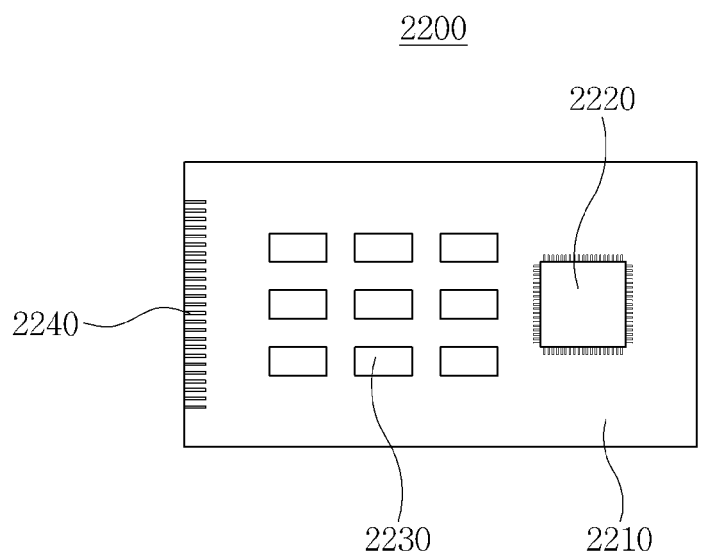
FIG. 9A is an exemplary conceptual view showing a semiconductor module, according to certain disclosed embodiments.

FIG. 9A is a conceptual view showing a semiconductor module 2200 in accordance with certain example embodiments. Referring to FIG. 9A, for example, the semiconductor module 2200 in accordance with some embodiments may include a processor 2220 and a plurality of semiconductor devices 2230, which may be mounted on a module substrate 2210. The processor 2220 or the plurality of semiconductor devices 2230 may include at least one of the MOSFET devices, as disclosed herein according to various embodiments. Conductive input/output terminals 2240 may be disposed on at least one side of the module substrate 2210.

Figure 9B:
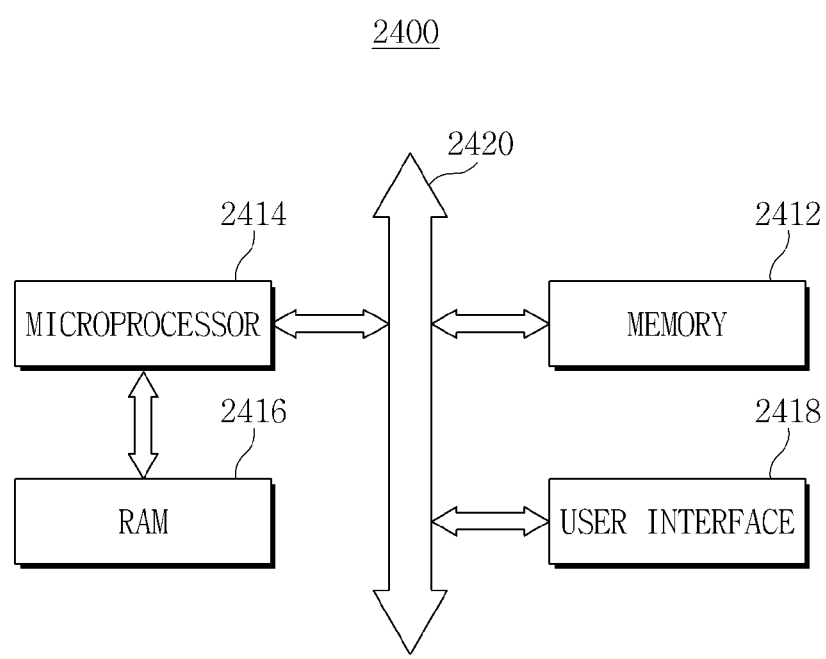
FIGS. 9B and 9C are exemplary conceptual block diagrams showing electronic systems, according to certain disclosed embodiments.

Referring to FIG. 9B, an electronic system 2400 in accordance with certain example embodiments may include a microprocessor 2414, a memory system 2412, and a user interface 2418 which may perform data communication using a bus 2420. The microprocessor 2414 may include one or more central processing units (CPUs) or application processors (APs). The electronic system 2400 may further include a RAM 2416 in communication with the microprocessor 2414 via bus 2420. In some embodiments, RAM 2416 may be in direct communication with the microprocessor 2414. The microprocessor 2414 and/or the RAM 2416 may be assembled within a single package. The user interface 2418 may be used to input data to the electronic system 2400, or output data from the electronic system 2400. For example, the user interface 2418 may include a touch pad, a touch screen, a keyboard, a mouse, a scanner, a voice detector, a cathode ray tube (CRT) monitor, a liquid crystal display (LCD), an active matrix organic light emitting diode (AMOLED), a plasma display pad (PDP), a printer, a lighting, or various input/output devices. The memory system 2412 may store operational codes of the microprocessor 2414, data processed by the microprocessor 2414, and/or data received from the outside. The memory system 2412 may include a memory controller, a hard disk, or a solid state drive (SSD). The microprocessor 2414, the RAM 2416, and/or the memory system 2412 may include at least one of the MOSFET devices according to various embodiments disclosed herein.

Figure 9C:
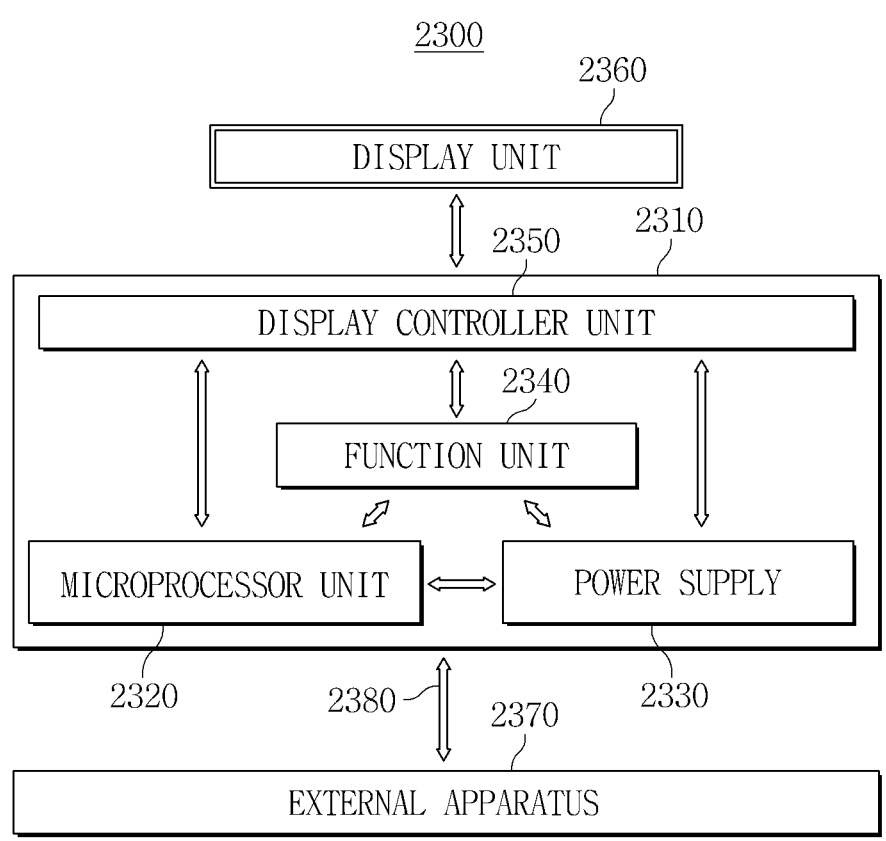

FIG. 9C is a conceptual block diagram showing an electronic system 2300 in accordance with certain example embodiments. Referring to FIG. 9C, the electronic system 2300 in accordance with some embodiments may include a body 2310, a display unit 2360, and an external apparatus 2370. The body 2310 may include one or more of a microprocessor unit 2320, a power supply 2330, a function unit 2340, and/or a display controller unit 2350. The body 2310 may include one or more of a system board or a motherboard having a printed circuit board (PCB) or the like, and/or a case. The microprocessor unit 2320, the power supply 2330, the function unit 2340, and the display controller unit 2350 may be mounted or disposed on an upper surface of the body 2310 or inside the body 2310. The display unit 2360 may be disposed on the upper surface of the body 2310 or inside/outside the body 2310. In some embodiments, the display unit 2360 may display an image processed by the display controller unit 2350. For example, the display unit 2360 may include a liquid crystal display (LCD), an organic light-emitting diode (OLED), an active-matrix OLED (AMOLED), or various other display panels. In some embodiments, the display unit 2360 may include a touch screen. Therefore, the display unit 2360 may have an input/output function. The power supply 2330 may supply a current or a voltage to the microprocessor unit 2320, the function unit 2340, the display controller unit 2350, etc. The power supply 2330 may include, for example, a charging battery, a socket for a dry cell, or a voltage/current converter. In some embodiments, the microprocessor unit 2320 may receive a voltage from the power supply 2330 to control the function unit 2340 and the display unit 2360. For example, the microprocessor unit 2320 may include one or more CPUs or APs. The function unit 2340 may include a touch pad, a touch screen, a volatile/non-volatile memory, a memory card controller, a camera, a lighting, an audio and moving picture playback processor, a wireless radio antenna, a speaker, a microphone, a universal serial bus (USB) port, or a unit having other various functions. The microprocessor unit 2320 or the function unit 2340 may include at least one of the MOSFET devices according to various disclosed embodiments.

In accordance with some exemplary embodiments, band-to-band tunneling of the MOSFET semiconductor devices may be reduced and/or the leakage current of the MOSFET semiconductor devices may be reduced in a narrow channel.

Also in accordance with some exemplary embodiments, in a trade-off between the performance and leakage current of the MOSFET semiconductor devices, the leakage current of the MOSFET semiconductor devices may be minimized even though a consumption voltage thereof is reduced.

Although a few embodiments have been described with reference to the accompanying drawings, those skilled in the art will readily appreciate that many modifications are possible in other embodiments without departing from the scope of the inventive concept and without changing essential features. Therefore, the above-described embodiments should be considered in a descriptive sense only and not for purposes of limitation.

What is claimed is:

1. A finFET device comprising:
an active region protruding from a substrate, wherein the active region comprises:
a channel region disposed at a center of the active region;
a drain region disposed on a first side of the channel region;
a source region disposed on a second side of the channel region opposite the first side;
a gate insulating layer formed on two opposing side surfaces of the channel region and having a U-shaped cross-section;
gate spacers formed on outer surfaces of the gate insulating layer;
drain spacers formed on two opposing side surfaces of the drain region; and
source spacers formed on two opposing side surfaces of the source region, and
wherein the two opposing side surfaces of the drain region are arranged so the drain region has a tapered region tapered in a direction extending away from the channel region, and
wherein a boundary between the channel region and the drain region has a same size as a boundary between the channel region and the source region.

2. The finFET device of claim 1, wherein the tapered region of the drain region is in contact with the drain spacers.

3. The finFET device of claim 1, wherein both of the two opposing side surfaces of the drain region have tapered parts.

4. The finFET device of claim 1, wherein the two opposing side surfaces of the drain region are perpendicular to the substrate and a top surface of the drain region, and extend from the substrate to the top surface of the drain region, and
wherein a center surface area of at least one of the two opposing side surfaces of the drain region is planar and both end surface areas of the at least one of the two opposing side surfaces of the drain region are tapered in directions extending toward the center surface area.

5. The finFET device of claim 1, wherein the two opposing side surfaces of the drain region are perpendicular to the substrate and a top surface of the drain region, and extend from the substrate to the top surface of the drain region, and
wherein at least one of the two opposing side surfaces of the drain region is tapered from a first end of the drain region nearest the channel region toward a central part of the drain region and tapered from a second end of the drain region farthest the channel region toward the central part of the drain region.

6. The finFET device of claim 1, wherein part of the drain region has a concave curved surface.

7. The finFET device of claim 1, wherein at least one of the two opposing side surfaces of the source region has a tapered part.

8. A finFET device comprising:
an active region protruding from a substrate, wherein the active region comprises:
a channel region;
a drain region disposed on a first side of the channel region in an X direction; and
a source region disposed on a second side of the channel region in the X direction; and
wherein the drain region has two side surfaces opposite in a Y direction perpendicular to the X direction, and the two side surfaces of the drain region form a first portion tapered as it extends away from the channel region and a second portion tapered as it extends toward the channel region.

9. The finFET device of claim 8, wherein both of the two side surfaces of the drain region are tapered.

10. The finFET device of claim 8, wherein at least a first side surface of the drain region is tapered from both ends of the drain region to a central part of the drain region.

11. The finFET device of claim 10, wherein the central part of the first side surface of the drain region is planar.

12. The finFET device of claim 8, wherein the source region has two side surfaces opposite in the Y direction, and a first of the two side surfaces of the source region is tapered.

13. The finFET device of claim 12, wherein the first side surface of the source region is tapered from both ends of the source region to a central part of the source region.

14. The finFET device of claim 13, wherein the central part of the first side surface of the source region is planar.

15. The finFET device of claim 8, wherein both of the two side surfaces of the source region are tapered.

16. The finFET device of claim 8, wherein at least a first side surface of the source region is tapered from both ends of the drain region to a central part of the drain region.

17. The finFET device of claim 16, wherein the central part of the first side surface of the source region is planar.

18. A nanowire FET device comprising:
- a first SiGe bulk body formed on a substrate, wherein conductive impurities are implanted into the first SiGe bulk body and the first SiGe bulk body is provided as a drain region;
- a gate pattern horizontally spaced apart from the first SiGe bulk body;
- a second SiGe bulk body horizontally spaced apart from the gate pattern, wherein conductive impurities are implanted into the second SiGe bulk body and the second SiGe bulk body is provided as a source region; and
- one or more nanowires which horizontally pass through the first SiGe bulk body, the gate pattern, and the second SiGe bulk body,
- wherein the nanowire includes a drain region which horizontally passes through the first SiGe bulk body, a channel region which passes through the gate pattern, and a source region which passes through the second SiGe bulk body, and wherein the drain region of the nanowire has a tapered surface, and
- wherein the drain region of the nanowire is tapered from the channel region to an end.

19. A nanowire FET device of claim 18, wherein the drain region of the nanowire has a concave tapered surface.

* * * * *